(12) United States Patent
Benson, Jr.

(10) Patent No.: US 9,415,539 B2
(45) Date of Patent: Aug. 16, 2016

(54) METHOD FOR MAKING MICROSTRUCTURED TOOLS HAVING DISCONTINUOUS TOPOGRAPHIES, AND ARTICLES PRODUCED THEREFROM

(75) Inventor: Olester Benson, Jr., Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 194 days.

(21) Appl. No.: 14/117,911

(22) PCT Filed: May 23, 2012

(86) PCT No.: PCT/US2012/039102
§ 371 (c)(1),
(2), (4) Date: Nov. 15, 2013

(87) PCT Pub. No.: WO2012/166462
PCT Pub. Date: Dec. 6, 2012

(65) Prior Publication Data
US 2014/0087140 A1     Mar. 27, 2014

Related U.S. Application Data

(60) Provisional application No. 61/491,575, filed on May 31, 2011.

(51) Int. Cl.
*B29C 33/38* (2006.01)
*B29C 59/16* (2006.01)
(Continued)

(52) U.S. Cl.
CPC ............. *B29C 59/16* (2013.01); *B29C 33/3842* (2013.01); *B29C 35/0894* (2013.01);
(Continued)

(58) Field of Classification Search
None
See application file for complete search history.

(56) References Cited

U.S. PATENT DOCUMENTS

| | | | |
|---|---|---|---|
| 3,357,772 A | 12/1967 | Rowland | |
| 3,357,773 A | 12/1967 | Rowland | |

(Continued)

FOREIGN PATENT DOCUMENTS

| | | |
|---|---|---|
| EP | 1 259 851 | 11/2002 |
| JP | H08-72140 A | 3/1996 |

(Continued)

OTHER PUBLICATIONS

Light-emitting diode—from Wikipedia, the free encyclopedia, [on line], [retrieved from internet on Nov. 8, 2013], URL:< http://en.wikipedia.org/wiki/Light-emitting_diode>, 36 pages.

(Continued)

*Primary Examiner* — Benjamin Schiffman
(74) *Attorney, Agent, or Firm* — Yufeng Dong

(57) ABSTRACT

A method for making a microstructured tool having interspersed topographies, and for producing articles therefrom, includes modifying a molding tool, by coating a radiation curable resin (430) on the first microstructured surface of the molding tool (490), contacting a second molding tool (480) having a second microstructured surface against the radiation curable resin (430) coated on the first microstructured surface of the first molding tool (490), exposing the radiation curable resin to a patterned (450,451,452) irradiation (440), separating the second molding tool (480) from the partially cured resin, and then removing non-irradiated radiation curable resin (region 432) from the molding tool (490) to provide a modified microstructured surface (region 431) on the molding tool. Articles having discontinuous or different microstructural features are also claimed.

10 Claims, 11 Drawing Sheets

(51) Int. Cl.
*G03F 7/00* (2006.01)
*G03F 7/20* (2006.01)
B29D 11/00 (2006.01)
B29C 39/02 (2006.01)
*B29C 35/02* (2006.01)
*B29C 35/08* (2006.01)
*B29C 37/00* (2006.01)
*B29L 11/00* (2006.01)

(52) U.S. Cl.
CPC ........ *B29C39/026* (2013.01); *B29D 11/00326* (2013.01); *G03F 7/0017* (2013.01); *G03F 7/2012* (2013.01); *B29C 35/0266* (2013.01); *B29C 35/0805* (2013.01); *B29C 35/0866* (2013.01); *B29C 37/0067* (2013.01); *B29C 2035/0827* (2013.01); *B29C 2035/0838* (2013.01); *B29C 2035/0877* (2013.01); *B29L 2011/0083* (2013.01); *G03F 7/0002* (2013.01); *Y10T 428/24479* (2015.01)

(56) References Cited

U.S. PATENT DOCUMENTS

| | | | |
|---|---|---|---|
| 3,449,158 | A | 6/1969 | Rowland |
| 3,469,898 | A | 9/1969 | Altman |
| 3,496,044 | A | 2/1970 | Rowland |
| 3,632,695 | A | 1/1972 | Howell |
| 3,658,528 | A | 4/1972 | Berman |
| 3,684,348 | A | 8/1972 | Rowland |
| 3,689,346 | A | 9/1972 | Rowland |
| 3,745,586 | A | 7/1973 | Braudy |
| 3,811,983 | A | 5/1974 | Rowland |
| 3,935,359 | A | 1/1976 | Rowland |
| 4,289,821 | A | 9/1981 | Gray, III |
| 4,322,450 | A | 3/1982 | Gray, III |
| 4,332,847 | A | 6/1982 | Rowland |
| 4,514,345 | A | 4/1985 | Johnson |
| 4,576,850 | A | 3/1986 | Martens |
| 4,588,258 | A | 5/1986 | Hoopman |
| 4,601,861 | A | 7/1986 | Pricone |
| 4,634,220 | A | 1/1987 | Hockert |
| 4,668,558 | A | 5/1987 | Barber |
| 4,703,999 | A | 11/1987 | Benson |
| 4,758,296 | A | 7/1988 | McGrew |
| 4,775,219 | A | 10/1988 | Appeldorn |
| 4,801,193 | A | 1/1989 | Martin |
| 4,877,717 | A | 10/1989 | Suzuki |
| 4,895,428 | A | 1/1990 | Nelson |
| 4,938,563 | A | 7/1990 | Nelson |
| 4,942,112 | A | 7/1990 | Monroe |
| 5,138,488 | A | 8/1992 | Szczech |
| 5,175,030 | A | 12/1992 | Lu |
| 5,183,597 | A | 2/1993 | Lu |
| 5,330,799 | A | 7/1994 | Sandor |
| 5,425,848 | A | 6/1995 | Haisma |
| 5,435,816 | A | 7/1995 | Spurgeon |
| 5,450,235 | A | 9/1995 | Smith |
| 5,491,586 | A | 2/1996 | Phillips |
| 5,600,484 | A | 2/1997 | Benson |
| 5,642,222 | A | 6/1997 | Phillips |
| 5,643,400 | A | 7/1997 | Bernard |
| 5,656,360 | A | 8/1997 | Faykish |
| 5,691,846 | A | 11/1997 | Benson, Jr. |
| 5,696,627 | A | 12/1997 | Benson |
| 5,706,132 | A | 1/1998 | Nestegard |
| 5,759,468 | A | 6/1998 | Smith |
| 5,763,049 | A | 6/1998 | Frey |
| 5,770,124 | A | 6/1998 | Marecki |
| 5,777,790 | A | 7/1998 | Nakajima |
| 5,780,140 | A | 7/1998 | Nilsen |
| 5,784,197 | A | 7/1998 | Frey |
| 5,876,805 | A | 3/1999 | Ostlie |
| 5,940,212 | A | 8/1999 | Johnson |
| 5,948,588 | A | 9/1999 | Sawyer |
| 6,024,455 | A | 2/2000 | O'Neill |
| 6,119,751 | A | 9/2000 | Nilsen |
| 6,120,636 | A | 9/2000 | Nilsen |
| 6,172,810 | B1 | 1/2001 | Fleming |
| 6,200,399 | B1 | 3/2001 | Thielman |
| 6,257,860 | B1 | 7/2001 | Luttrell |
| 6,288,842 | B1 | 9/2001 | Florczak |
| 6,318,867 | B1 | 11/2001 | Bacon, Jr. |
| 6,636,363 | B2 | 10/2003 | Kaminsky |
| 6,663,246 | B2 | 12/2003 | Currens |
| 6,703,108 | B1 | 3/2004 | Bacon, Jr. |
| 6,805,957 | B1 | 10/2004 | Santos |
| 6,858,253 | B2 | 2/2005 | Williams |
| 7,068,434 | B2 | 6/2006 | Florczak |
| 7,079,915 | B2 | 7/2006 | Huang |
| 7,156,527 | B2 | 1/2007 | Smith |
| 7,188,960 | B2 | 3/2007 | Smith |
| 7,230,764 | B2 | 6/2007 | Mullen |
| 7,250,122 | B2 | 7/2007 | Mullen |
| 7,330,315 | B2 | 2/2008 | Nilsen |
| 7,401,550 | B2 | 7/2008 | Lutz |
| 7,406,239 | B2 | 7/2008 | Ouderkirk |
| 7,410,604 | B2 | 8/2008 | Erickson |
| 7,442,442 | B2 | 10/2008 | Strobel |
| 7,517,205 | B2 | 4/2009 | Mullen |
| 7,556,386 | B2 | 7/2009 | Smith |
| 7,607,584 | B2 | 10/2009 | Kanevsky |
| 7,611,251 | B2 | 11/2009 | Thakkar |
| 7,824,516 | B2 | 11/2010 | Amos |
| 7,862,187 | B2 | 1/2011 | Thakkar |
| 8,027,086 | B2 | 9/2011 | Guo |
| 2001/0048169 | A1 | 12/2001 | Nilsen |
| 2002/0186472 | A1 | 12/2002 | Sloot |
| 2004/0190102 | A1 | 9/2004 | Mullen |
| 2005/0141243 | A1 | 6/2005 | Mullen |
| 2005/0258637 | A1 | 11/2005 | Bi |
| 2006/0001937 | A1 | 1/2006 | Drinkwater |
| 2006/0210714 | A1 | 9/2006 | Huizinga |
| 2007/0099478 | A1 | 5/2007 | Petersen |
| 2007/0209244 | A1 | 9/2007 | Prollius |
| 2007/0236939 | A1 | 10/2007 | Ouderkirk |
| 2008/0012162 | A1 | 1/2008 | Chapman |
| 2008/0085481 | A1 | 4/2008 | Merrill |
| 2008/0212181 | A1 | 9/2008 | Wu |
| 2008/0248212 | A1 | 10/2008 | Muggli |
| 2008/0276817 | A1 | 11/2008 | Hinch |
| 2008/0304284 | A1 | 12/2008 | Guo et al. |
| 2008/0304287 | A1 | 12/2008 | Chiang |
| 2009/0029054 | A1 | 1/2009 | Yapel |
| 2009/0122405 | A1 | 5/2009 | Mimura |
| 2009/0184441 | A1 | 7/2009 | Yang et al. |
| 2010/0072661 | A1 | 3/2010 | Cho et al. |
| 2010/0103521 | A1 | 4/2010 | Smith |
| 2010/0219626 | A1 | 9/2010 | Dietemann |
| 2010/0226009 | A1 | 9/2010 | Smith |
| 2010/0232019 | A1 | 9/2010 | Smith |
| 2010/0277801 | A1 | 11/2010 | Nakajima |

FOREIGN PATENT DOCUMENTS

| | | |
|---|---|---|
| JP | 2004506547 A | 4/2004 |
| JP | 2004-255680 A | 9/2004 |
| JP | 2006007608 A | 1/2006 |
| JP | 2007007988 A | 1/2007 |
| JP | 2009028996 A | 2/2009 |
| JP | 2009532230 A | 9/2009 |
| JP | 2009/294405 | 12/2009 |
| JP | 2010258326 A | 11/2010 |
| JP | 2010287621 A | 12/2010 |
| WO | WO 96/30786 | 10/1996 |
| WO | WO 99/40462 | 8/1999 |
| WO | WO 01/74560 | 10/2001 |
| WO | WO 02/34855 | 5/2002 |
| WO | WO 03/069741 | 8/2003 |
| WO | WO 2004/078477 A1 | 9/2004 |
| WO | WO 2005/005121 | 1/2005 |
| WO | WO 2005/069085 | 7/2005 |
| WO | WO 2005/119350 | 12/2005 |
| WO | WO 2006/138129 | 12/2006 |

(56) References Cited

FOREIGN PATENT DOCUMENTS

| WO | WO 2007/121284 | 10/2007 |
| WO | WO 2009/006252 | 1/2009 |
| WO | WO 2009/009258 | 1/2009 |
| WO | WO 2009/042118 | 4/2009 |
| WO | 2009/148138 A1 | 12/2009 |
| WO | WO 2010/048416 | 4/2010 |
| WO | WO 2010/065247 | 6/2010 |
| WO | WO 2011/002617 | 1/2011 |
| WO | WO 2011/031501 | 3/2011 |
| WO | WO 2011/060086 | 5/2011 |
| WO | WO 2012/166447 | 12/2012 |
| WO | WO 2012/166448 | 12/2012 |
| WO | WO 2012/166460 | 12/2012 |

OTHER PUBLICATIONS

Disclosed Anonymously, "Improvements to Continuous Casting Processes", IP.com No. IPCOM000167282D, IP.com Electronic Publication: Feb. 6, 2008.

*Structured Illumination as a Processing Method for Controlling Photopolymerized Coating Characteristics*, Peter Ganahl, PhD Thesis, University of Iowa, 2007.

Torigoe, et al., Sep. 2004 ICSTS conference proceedings for "Study of Embossing by Casting, Curing and Peeling on a Patterned Roll".

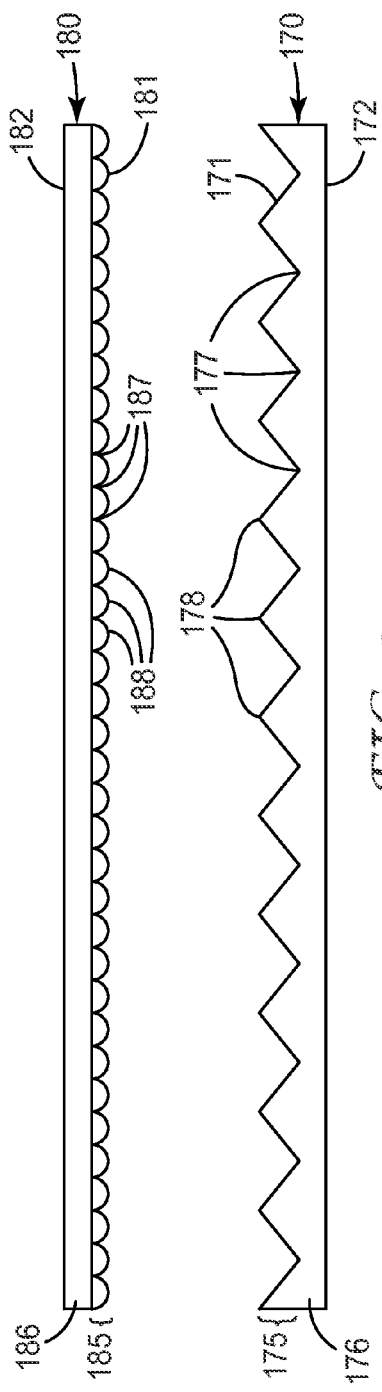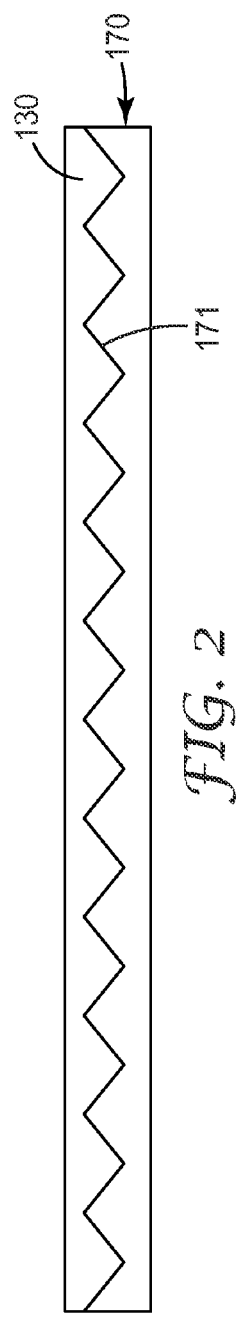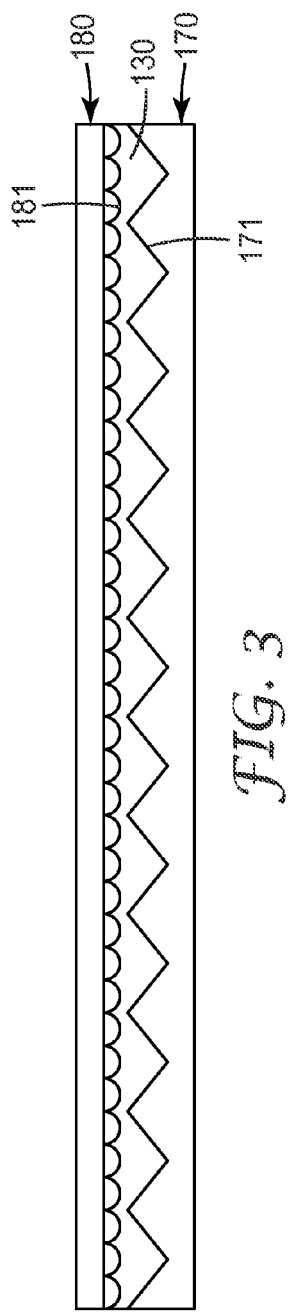

METHOD FOR MAKING MICROSTRUCTURED TOOLS HAVING DISCONTINUOUS TOPOGRAPHIES, AND ARTICLES PRODUCED THEREFROM

CROSS REFERENCE TO RELATED APPLICATIONS

This application is a national stage filing under 35 U.S.C. 371 of PCT/US2012/039102, filed May 23, 2012, which claims priority to U.S. Provisional Patent Application No. 61/491,575, filed May 31, 2011, the disclosures of which are incorporated by reference in their entirety herein.

BACKGROUND

Microstructured composite films are produced using metal molding tools of exacting dimensions that can be time consuming and expensive to make. Many methods for using a patterned tool to replicate a complementary pattern in the surface of a film are well known. However, in many instances the pattern resulting from the replication method may be limited by the tool (e.g., certain pattern configurations do not lend themselves to being replicated by conventional replication methods). Many times there is a need to produce films that bear alphanumerics, security marks, light modulating features, or customized decorative patterns.

SUMMARY

What is needed is a method, preferably that is relatively rapid and relatively low-cost, for creating a variety of differentially pattern cured microstructured articles without permanent physical modification of a microreplication tool.

In one aspect, methods described herein include making a molding tool, by coating a radiation curable resin on the first microstructured surface of the molding tool, exposing the radiation curable resin to a patterned irradiation, and then removing non-irradiated radiation curable resin from the molding tool to provide a modified microstructured surface on the molding tool. Methods are also disclosed herein for introducing at least one region of a second microstructured surface to the first microstructured surface of the first molding tool, by contacting a second molding tool having a second microstructured surface (which is typically coated with a release agent) against a radiation curable resin coated on the first microstructured surface of the first molding tool prior to the patterned irradiation, performing the patterned irradiation and subsequently removing the second molding tool and the radiation curable resin from at least one non-irradiated region of the modified first molding tool. In some embodiments, the radiation curable material is selected to be sufficiently durable, after irradiation, to withstand molding processes as part of the modified first molding tool, while also being removable (e.g., by physical or chemical treatment), to restore the modified first molding tool to its unmodified condition. The modified first molding tool can optionally be treated to make the modification more permanent, using methods known to those in the art (e.g., by depositing a metal layer on the modified microstructured surface). The modified first molding tool can be used as a molding tool in at least some embodiments of methods described herein for making differentially pattern cured microstructured articles.

In some embodiments, the present disclosure describes a method of making a molding tool, the method comprising providing a first molding tool having a first microstructured surface that includes a first plurality of cavities; providing a second molding tool having a second microstructured surface that includes a second plurality of cavities; filling at least one of the first or second pluralities of cavities with a radiation curable resin; contacting the first and second molding tools against the radiation curable resin such that the first and second pluralities of cavities face each other with a layer of the radiation curable resin therebetween and in contact with the first and second pluralities of cavities; exposing the layer of the radiation curable resin to a patterned irradiation through at least one of the first molding tool or the second molding tool to provide a corresponding partially cured resin layer comprising at least one first region and at least one second region, wherein the at least one first region is irradiated by the patterned irradiation and the at least one second region is not irradiated by the patterned irradiation, and wherein at least one of the first molding tool or the second molding tool is transparent to the patterned irradiation; separating the second molding tool from the partially cured resin; and separating the non-irradiated regions of the partially cured resin from the first molding tool, to provide a molding tool having a microstructured surface that includes a pattern of a matrix of first microstructural features and at least one discontinuous region of second microstructural features.

In another aspect, the present disclosure describes an article having a first major surface comprising first microstructural features within a matrix of second microstructural features, wherein the first microstructural features are discontinuous, wherein collectively the first and second microstructural features form a pattern visible at least when viewed normal to the first major surface, and wherein the first and second microstructural features are independently selected from the group consisting of cones, diffraction gratings, lenticulars, segments of a sphere, pyramids, cylinders, fresnels, and prisms.

In another aspect, the present disclosure describes an article having a first major surface comprising first microstructural features and second microstructural features arranged in a pattern visible at least when viewed normal to the first major surface, wherein the first and second microstructural features are different relative to each other, and are selected from the group consisting of cones, diffraction gratings, lenticulars, segments of a sphere, pyramids, cylinders, fresnels, and prisms.

"Cured" in reference to polymers refers to polymers made by cross-linking liquid, flowable or formable monomeric or oligomeric precursors by application of an appropriate energy source to produce a solid material by various means including free-radical polymerization, cationic polymerization, and anionic polymerization.

"Cured oligomeric resin" refers to polymeric materials made by curing certain curable compositions comprising pre-polymeric materials having at least two repeating monomeric units which may be mixed with other monomeric materials;

"Differentially pattern cured" refers to the pattern of curing in a radiation curable material upon exposure to a patterned irradiation, wherein different levels of curing occur to form a visible pattern in the radiation curable material.

"Opaque" refers to a mask that substantially absorbs or reflects a given irradiation (i.e., at least 90% of the given irradiation is absorbed or reflected, typically at least 95% of the given irradiation is absorbed or reflected).

"Partially cured" refers to part of a radiation curable resin being cured to such a degree that it will not substantially flow.

"Pattern" refers to a spatially varying appearance. The term "pattern" is at least one of a uniform or periodic pattern, a varying pattern, or a random pattern.

"Patterned irradiation" refers to at least one of irradiating through transparent regions of a mask, guiding a beam of light, guiding a beam of electrons, or projecting a digital image.

"Security mark" refers to an element on or in an article of the present disclosure that is surrounded by a background appearance. In many embodiments the security mark is an "island" feature surrounded by a continuous background appearance. The security mark can change appearance to a viewer as the viewer changes their point of view of the security mark.

"Visible" refers to being apparent and identifiable (i.e., to ascertain definitive characteristics of) to the unaided human eye of normal (i.e., 20/20) vision. By "unaided", it is meant without the use of a microscope or magnifying glass.

Many combinations of molding tools, patterned irradiation techniques, and radiation curable materials are included in the methods described herein. Using these methods, a wide variety of differentially pattern cured microstructured articles can be produced without requiring costly modification of a molding tool.

Exemplary uses of the methods described herein include the production of articles having a product security mark, a logo, a trademark, a decorative appearance, and light management properties (e.g., for transmitted light, reflected light, or retroreflected light).

BRIEF DESCRIPTION OF THE DRAWINGS

FIGS. 1 to 4A illustrate steps in an exemplary method of present disclosure for making a molding tool;

Figure 4A:
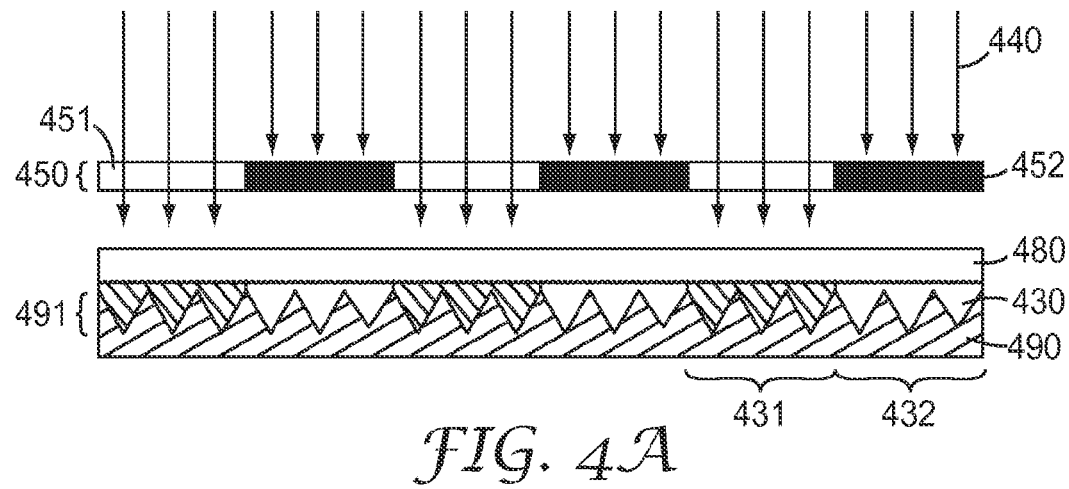

Like reference numbers in the various figures indicate like elements. However, it will be understood that the use of a number to refer to a component in a given figure is not intended to limit the component in another figure labeled with the same number. Some elements may be present in identical or equivalent multiples; in such cases only one or more representative elements may be designated by a reference number but it will be understood that such reference numbers apply to all such identical elements. Unless otherwise indicated, all figures and drawings in this document are not to scale and are chosen for the purpose of illustrating different exemplary embodiments of the description. In particular the dimensions of the various components are depicted in illustrative terms only, and no relationship between the dimensions of the various components should be inferred from the drawings, unless so indicated. Although terms such as "top", bottom", "upper", lower", "under", "over", "front", "back", "outward", "inward", "up" and "down", and "first" and "second" may be used in this disclosure, it should be understood that those terms are used in their relative sense only unless otherwise noted. In particular, in some embodiments certain components may be present in interchangeable and/or identical multiples (e.g., pairs). For these components, the designation of "first" and "second" may apply to the order of use, as noted herein (with it being irrelevant as to which one of the components is selected to be used first).

DETAILED DESCRIPTION

The ability to produce molding tools with microstructures bearing multiple complex unrelated features at various orientations is not achievable with conventional machining techniques. If such a machining technique did exist in order to achieve any of these desired outcomes, a specialty tool would need to be fabricated for each outcome.

The present disclosure describes methods to produce patterned articles bearing interspersed microstructures. In some embodiments, the patterned articles are characterized by having patterns of microstructures comprising one topography surrounded by microstructures of at least one different topography. In some embodiments, the patterned articles have patterns of microstructures comprising one topography surrounded by microstructures of the same topography in at least one different orientation.

In some embodiments, a patterned molding tool is produced by coating a molding tool bearing an array of microstructures with a radiation curable resin; laminating the structured side of a release film bearing a second microstructure to the resin; placing a mask in intimate contact with the release film; passing radiation through the mask and structured release film to cure the resin; removing the mask and structured release liner; removing the uncured resin from the tool with a suitable solvent; and applying a release coating to the patterned molding tool. The patterned tool can be used, for example, to produce articles by cast and cure microreplication or replicated by nickel electroforming to produce a metallic nickel tool suitable for cast and cure and other alternative manufacturing processes including compression molding, extrusion embossing, or injection molding.

The term "microstructure", used herein in the context of an article having a surface bearing microstructure, means the configuration of a surface which depicts or characterizes the predetermined desired utilitarian purpose or function of said article. Discontinuities, such as projections and indentations in the surface will deviate in profile from the average profile or center line drawn through the microstructure such that the sum of the areas embraced by the surface profile above the line is equal to the sum of those areas below the line, said line being essentially parallel to the nominal surface (bearing the microstructure) of the article. The heights of said deviations will be ±0.005 micrometer to ±750 micrometers through a representative characteristic length of the surface (e.g., 1 centimeter to 30 centimeters). Said average profile, or center line, can be plano, concave, convex, aspheric, or combinations thereof. Articles where said deviations are of low order (e.g., from ±0.005 micrometer to ±0.1 micrometer or, preferably, from ±0.005 micrometer to ±0.05 micrometers) and said deviations are of infrequent or minimal occurrence (i.e., the surface is free of any significant discontinuities), are those where the microstructure-bearing surface is an essentially "flat" or "perfectly smooth" surface, such articles being useful, for example, as precision optical elements or elements with a precision optical interface, such as ophthalmic lenses. Articles where said deviations are of said low order and frequent occurrence are those, for example, bearing utilitarian discontinuities, as in the case of articles having antireflective microstructure. Articles where said deviations are of high order (e.g., from ±0.1 micrometer to ±750 micrometer) and attributable to microstructure comprising a plurality of utilitarian discontinuities which are the same or different and spaced apart or contiguous in a random or ordered manner, are articles such as retroreflective cube-corner sheeting, linear Fresnel lenses, and video discs. The microstructure-bearing surface can contain utilitarian discontinuities of both said low and high orders. The microstructure-bearing surface may contain extraneous or non-utilitarian discontinuities so long as the amounts or types thereof do not significantly interfere with or adversely affect the predetermined desired utilities of said articles. In some embodiments, microstructural elements include at least one of cones, diffraction gratings, lenticulars, segments of a sphere, pyramids, cylinders, fresnels, or prisms. It may be necessary or desirable to select a particular oligomeric composition whose shrinkage upon curing does not result in said interfering extraneous discontinuities (e.g., a composition which shrinks only 2% to 6%). The profiles and the dimensions and spacing of said discontinuities are those discernible by an electron microscope at 1000× to 100,000×, or an optical microscope at 10× to 1000×.

FIG. 1 illustrates an exemplary embodiment of first microstructured tool 170 and second microstructured tool 180. First microstructured tool 170 includes body portion 176 having opposed first and second major surfaces 171, 172. First major surface 171 includes microstructured layer 175, which includes first plurality of cavities 177 and first plurality of peaks 178. Second microstructured tool 180 includes body portion 186 having first major surface 181 generally opposite second major surface 182, and first major surface 181 includes microstructured layer 185, having second plurality of cavities 187 and second plurality of peaks 188.

FIG. 2 illustrates first major surface 171 of first microstructured tool 170 contacting a radiation curable resin 130. FIG. 3 illustrates first and second molding tools 170 and 180 contacting against radiation curable resin 130 such that the first pluralities of cavities 177 and second plurality of cavities 188 face each other with layer of the radiation curable resin 130 therebetween and in contact with first and second pluralities of cavities 177 and 188.

FIG. 4A illustrates a patterned irradiation of radiation curable resin 430 sandwiched between first microstructured tool 490 and second microstructured tool 480, with the same relative configuration of microstructured layers as in FIG. 3. In the configuration shown in FIG. 4A, irradiation 440 passes through mask 450 in radiation transparent regions 451, while radiation opaque regions 452 block at least 90% of radiation 440 incident upon radiation opaque regions 452.

In exemplary embodiments of the method described herein, at least one of the first or second molding tools is transparent to the patterned irradiation. Irradiation of a radiation curable resin through a transparent molding tool is described, for example, in U.S. Pat. No. 5,435,816 (Spurgeon et al.) and U.S. Pat. No. 5,425,848 (Haisma et al.). In the exemplary embodiment illustrated in FIG. 4A, second microstructured tool 480 is selected to be transparent to irradiation 440.

Irradiating 440 passing through radiation transparent regions 451 in mask 450 and then through radiation transparent microstructured tool 480 at least partially cures radiation curable resin 430 in first region 431, while radiation curable resin 430 in second region 432 does not receive any more than 10% of radiation 440 incident on radiation opaque regions 452 in mask 450. Subsequent to the patterned irradiation of radiation curable resin 430, second microstructured tool 480 is separated from the at least partially cured radiation curable resin on microstructured tool 490, and radiation curable resin from second regions (i.e., "non-irradiated" regions) is removed, typically by washing with a suitable solvent (e.g., ethanol, although other solvents may be useful, depending on the nature of the radiation curable resin).

Figure 4B:
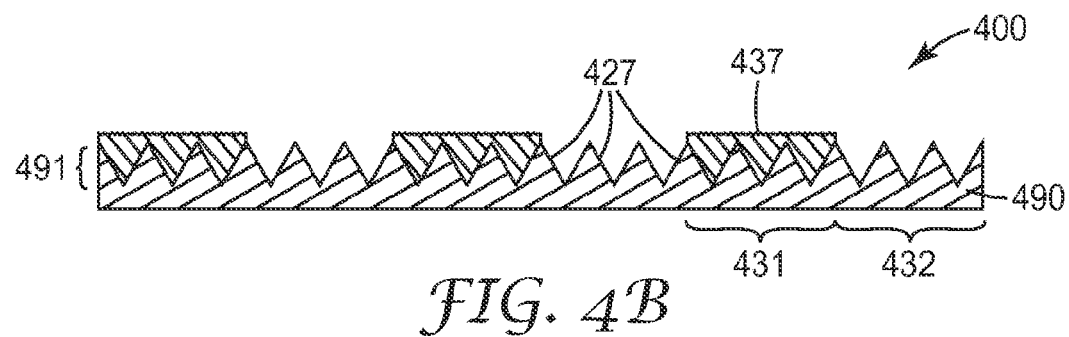
FIG. 4B illustrates an exemplary embodiment of an exemplary molding tool of the present disclosure.
Figure 4C:
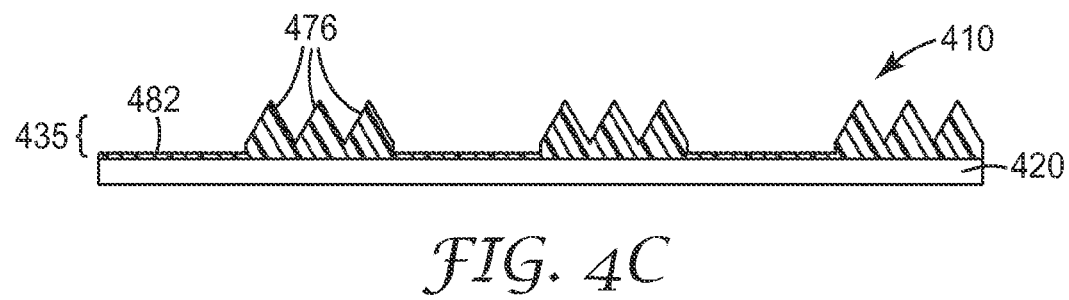
FIG. 4C illustrates an exemplary embodiment of an article of the present disclosure.

FIG. 4B illustrates exemplary molding tool 400 made according to a method of the present description, having a microstructured layer 491 that includes plurality of cavities 427 interspersed with plurality of cavities 437. Molding tool 400 can optionally be treated with a release coating to facility the replication of articles from the surface of microstructured layer 491.

It will be noted from the above description that molding tool 400 is a modified version of first molding tool 490, and it should also be noted that modification of first molding tool 490 to form molding tool 400 did not require any machining of molding tool 490, and could be carried out with a wide selection of second molding tools 480 to produce a correspondingly wide selection of molding tools 400. An additional advantage of the present method is that the radiation curable resin can be selected to be sufficiently durable after radiation curing to permit replication of molding tool 400, while also being removable under suitable conditions in order to restore first molding tool 490 to its original, unmodified condition, thereby enabling a wide selection of molding tools 400 to be made (sequentially) from a single molding tool 490.

Figure 5:
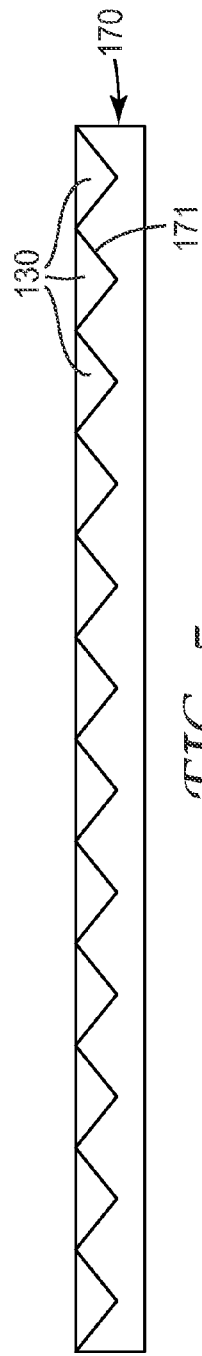
FIGS. 5 and 6 illustrate steps in an exemplary method of present disclosure for making a molding tool.
Figure 6:
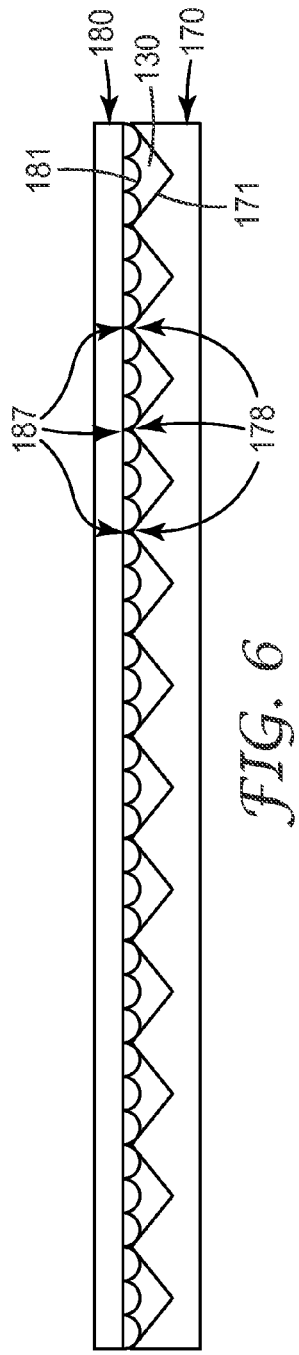
Figure 7:
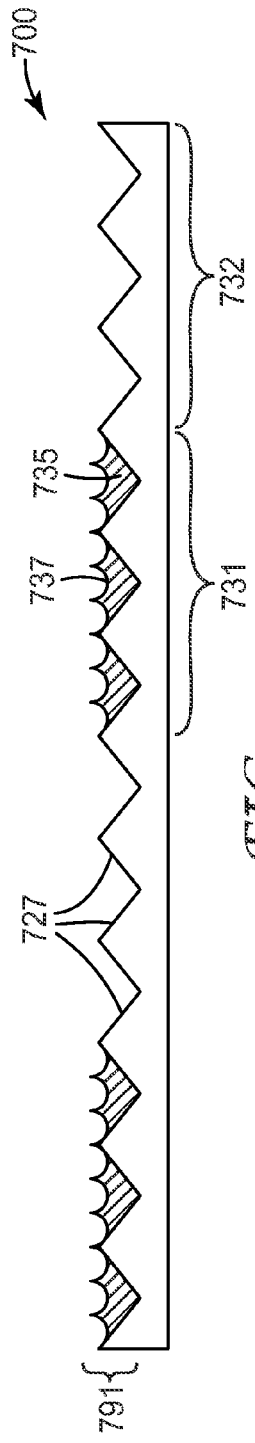
FIG. 7 illustrates an exemplary embodiment of an exemplary molding tool of the present disclosure.

In some exemplary embodiments, first major surface 171 of first structured tool 170 and first major surface 181 of second structured tool 180 are sufficiently complementary to permit first plurality of peaks 178 to nest within second plurality of cavities 187. FIG. 5 illustrates first major surface 171 of first microstructured tool 170 contacting a radiation curable resin 130, and FIG. 6 illustrates a first and second molding tools 170 and 180 each contacting against radiation curable resin 130 such that first pluralities of cavities 177 and second plurality of cavities 188 face each other with layer of the radiation curable resin 130 therebetween. First plurality of peaks 178 is nested in second plurality of cavities 187, and FIG. 7 illustrates exemplary molding tool 700 resulting from a patterned irradiation of the radiation curable resin 130 shown in FIG. 6, followed by removal of second molding tool 180 and removal of non-irradiated radiation curable resin, which in turn results in having a microstructured layer 791 in exemplary molding tool 700 that includes plurality of cavities 727 (in non-irradiated regions 732) interspersed with plurality of cavities 737 (in irradiated regions 731) defined within cured resin 735.

In exemplary embodiments of the methods described herein that require irradiation, examples of types of irradiation include electron beam, ultraviolet light, and visible light. Electron beam radiation, which is also known as ionizing radiation, can be used typically at a dosage in a range from about 0.1 Mrad to about 10 Mrad (more typically in a range from about 1 Mrad to about 10 Mrad. Ultraviolet radiation refers to non-particulate radiation having a wavelength within the range of about 200 to about 400 nanometers (typically within the range of about 250 to about 400 nanometers). Typically, the ultraviolet radiation can be provided by ultraviolet lights at a dosage of 50 to 1500 millijoules/cm$^2$. Visible radiation refers to non-particulate radiation having a wavelength within the range of about 400 nanometers to about 700 nanometers.

Any suitable patterned irradiation can be used that provides a correspondingly patterned partially cured resin having at least one first region and at least one second region, wherein the at least one first region is irradiated by the patterned irradiation and the at least one second region is not irradiated by the patterned irradiation. "Not irradiated" can include a minor amount of irradiation, but not more than 10% (in some embodiments up to 5%, 2%, or even 1%, as well as zero) of the level of irradiation to which the at least one first region is exposed.

An example of patterned irradiation of radiation curable resin includes at least one of irradiating through transparent regions of a mask, guiding a beam of light, guiding a beam of electrons, or projecting a digital image. Combinations of these patterned irradiation techniques may also be used. Suitable adjustment of power level, irradiation time, and distance from the radiation curable resin may be made to obtain a desired level of curing of the resin.

Embodiments of irradiating through transparent regions of a mask include using a mask having at least one transparent region and at least one opaque region. The transparency and opacity of regions in the mask are selected with respect to the irradiation source(s). For example, in some embodiments, when the irradiation source is visible light, a suitable mask can include a film that is transparent to visible light and having at least one opaque (to visible light) region printed thereon (e.g., by a laser printer). In some other embodiments, when the irradiation source is UV light, a suitable mask can include can include a film that is transparent to visible light and having at least one opaque (to UV light) region printed thereon. In some other embodiments, where, for example, electron beam irradiation is used, a suitable mask may include a sheet of aluminum having open (i.e., transparent) regions therein.

In some embodiments, the radiation curable resin is at least partially curable by visible light, and a suitable irradiation source provides at least visible light and is other than a laser light source. Suitable examples of visible light sources are well known in the art (e.g., fluorescent lamps).

In some embodiments, the radiation curable resin is at least partially curable by UV light, and a suitable irradiation source provides at least UV light and is other than a laser light source. Suitable irradiation sources that provide UV light are well known in the art, and include, for example, an array of light emitting diode (LED) lamps (including those available, for example, from Clearstone Technologies, Minneapolis, Minn., under the trade designation "MODEL LN 120-395B-120"), and in some embodiments the irradiation conditions include irradiating with 395 nanometer UV light with an energy output level of about 170 milliwatts per square centimeter.

In some embodiments, the radiation source can be a laser providing a beam of light. The beam of light can be guided relative to the radiation curable resin (e.g., with mirrors, or by moving the molding tool, or both) to generate the patterned irradiation. The laser used for irradiating the radiation curable resin may be any suitable laser operating at a visible and/or ultraviolet output wavelength. Examples of suitable lasers include gas lasers, excimer lasers, solid state lasers, and chemical lasers. Exemplary gas lasers include: argon-ion lasers (e.g., those which emit light at 458 nm, 488 nm or 514.5 nm); carbon-monoxide lasers (e.g., those which can produce power of up to 500 kW); and metal ion lasers, which are gas lasers that generate deep ultraviolet wavelengths (e.g., helium-silver (HeAg) 224 nm lasers and neon-copper (NeCu) 248 nm lasers).

Chemical lasers include excimer lasers, which are powered by a chemical reaction involving an excited dimer (i.e., an "excimer") having a short-lived dimeric or heterodimeric molecule formed from two species (atoms), at least one of which is in an excited electronic state. They typically produce ultraviolet light. Commonly used excimer molecules include noble gas compounds (KrCl (222 nm), KrF (248 nm), XeCl (308 nm), and XeF (351 nm)).

Solid state laser materials are commonly made by doping a crystalline solid host with ions that provide the required energy states. Examples include ruby lasers (e.g., made from ruby or chromium-doped sapphire). Another common type is made from neodymium-doped yttrium aluminum garnet (YAG), known as Nd:YAG. Nd:YAG lasers can produce high powers in the infrared spectrum at 1064 nm. Nd:YAG lasers are also commonly frequency doubled to produce 532 nm when a visible (green) coherent source is desired.

The laser may be used in pulsed and/or continuous wave mode. For example, the laser may operate at least partially in continuous wave mode and/or at least partially in pulsed mode.

The laser beam is typically optically directed or scanned and modulated to achieve the desired irradiation pattern. The laser beam may be directed through a combination of one or more mirrors (e.g., rotating mirrors and/or scanning mirrors) and/or lenses. Alternatively or in addition, the substrate can be moved relative to the laser beam.

In some embodiments, the source of irradiation is a beam of electrons. A suitable mask (e.g., an aluminum mask) can be used in conjunction with the beam of electrons to generate a patterned irradiation. An example of a suitable electron beam ("e-beam") system is available from Energy Sciences Inc., Wilmington, Mass., under the trade designation "MODEL CB-300 ELECTRON BEAM SYSTEM". Alternatively, electron beam lithography can be used to guide a beam of electrons in a patterned irradiation. Suitable operating conditions can be selected depending on the radiation curable resin being used. In some embodiments, the electron beam system can be operated at 200 kV voltage to deliver a dose of 2-5 megarads to provide cure to the radiation curable resin.

In some embodiments, methods described herein include irradiation using a projection of a digital image. Any suitable projection technique to project irradiation as a digital image may be used. Projection of a digital image may be achieved, for example, using a plane light source with cooperation of a digital micromirror device or liquid crystal display to scan selected zones of the radiation curable resin to cause a patterned irradiation, as has been used in rapid prototyping technology (see, e.g., U.S. Pat. No. 7,079,915 (Huang et al.)).

Compositions curable by UV irradiation generally include at least one photoinitiator. The photoinitiator can be used at a concentration in a range from 0.1 wt. % to 10 wt. %. More typically, the photoinitiator is used at a concentration in a range from 0.2 wt. % to 3 wt. %.

In general the photoinitiator is at least partially soluble (e.g., at the processing temperature of the resin) and substantially colorless after being polymerized. The photoinitiator may be colored (e.g., yellow), provided that the photoinitiator is rendered substantially colorless after exposure to the UV light source.

Suitable photoinitiators include monoacylphosphine oxide and bisacylphosphine oxide. Available mono or bisacylphosphine oxide photoinitiators include 2,4,6-trimethylbenzoyldiphenylphosphine oxide, available from BASF Corporation, Clifton, N.J., under the trade designation "LUCIRIN TPO", ethyl-2,4,6-trimethylbenzoylphenyl phosphinate, also available from BASF Corporation, under the trade designation "LUCIRIN TPO-L", and bis(2,4,6-trimethylbenzoyl)-phenylphosphine oxide available from Ciba Specialty Chemicals, Tarrytown, N.Y., under the trade designation "IRGACURE 819". Other suitable photoinitiators include 2-hydroxy-2-methyl-1-phenyl-propan-1-one, available from Ciba Specialty Chemicals, under the trade designation "DAROCUR 1173", as well as other photoinitiators available from Ciba Specialty Chemicals, under the trade designations "DAROCUR 4265", "IRGACURE 651", "IRGACURE 1800", "IRGACURE 369", "IRGACURE 1700", and "IRGACURE 907".

Free radical scavengers or antioxidants may be used, typically, in a range from about 0.01 wt. % to 0.5 wt. %. Suitable antioxidants include hindered phenolic resins such as those available from Ciba Specialty Chemicals, under the trade designations "IRGANOX 1010", "IRGANOX 1076", "IRGANOX 1035", and "IRGAFOS 168".

Radiation curable resin that forms the articles of the present disclosure can be cured in one or more steps. For example, radiation sources (e.g., ultraviolet light, visible light, e-beam) can be selected depending on the nature of the radiation curable resin.

Exemplary radiation curable polymeric materials include reactive resin systems capable of being cross-linked by a free radical polymerization mechanism by exposure to actinic radiation (e.g., electron beam, ultraviolet light, or visible light). Radiation-initiated cationically polymerizable resins also may be used. Reactive resins suitable for forming the array of elements may be blends of photoinitiator and at least one compound bearing an acrylate group. Preferably, the resin blend contains a monofunctional, a difunctional, or a polyfunctional compound to ensure formation of a cross-linked polymeric network upon irradiation.

Illustrative examples of resins that are capable of being polymerized by a free radical mechanism that can be used herein include acrylic-based resins derived from epoxies, polyesters, polyethers, and urethanes, ethylenically unsaturated compounds, aminoplast derivatives having at least one pendant acrylate group, isocyanate derivatives having at least one pendant acrylate group, epoxy resins other than acrylated epoxies, and mixtures and combinations thereof. The term acrylate is used here to encompass both acrylates and methacrylates.

Other illustrative examples of radiation curable resins useful in the present description can include polymerizable thiol-ene compositions having at least one monomer or oligomer having a plurality of free-radicaly polymerizable ethylenically unsaturated groups, and at least one compound having a plurality of thiol groups, and an initiator (e.g., those described in U.S. Pat. No. 5,876,805 (Ostlie), the disclosure of which is incorporated herein by reference).

A molding tool of the current disclosure can include a roll, a continuous belt, a film, a metal plate, and a glass plate. For continuous production of articles of the current disclosure, the molding tool is typically a roll or a continuous belt. The molding tool has a microstructured molding surface having a plurality of cavities opening thereon which have the shape and size suitable for forming desired elements (e.g., cube-corner elements). The cavities, and thus resultant elements may be, for example cube-corner elements such as three sided pyramids having one cube-corner each (e.g., such as are disclosed in the U.S. Pat. No. 4,588,258 (Hoopman)) have a rectangular base with two rectangular sides and two triangular sides such that each element has two cube-corners each (e.g., such as are disclosed in U.S. Pat. No. 4,938,563 (Nelson et al.)), or of other desired shape, having at least one cube corner each (e.g., such as are disclosed in U.S. Pat. No. 4,895,428 (Nelson et al.)). It will be understood by those skilled in the art that any cube-corner element may be used in accordance with the present disclosure. The shape of the tooling cavities, and thus resultant article structures, may also be, for example, curve-sided prisms, truncated pyramids, lenslets, micro-needles, fasteners, stems, micro-flow channels and a variety of other geometries. The pitch of the surface refers to the repeat distance from one cavity or structure to the next adjacent cavity or structure.

In some embodiments of the method described herein, irradiations can be performed by irradiation through a transparent molding tool, such as disclosed in U.S. Pat. No. 5,435,816 (Spurgeon et al.).

In some embodiments, it may be desirable to provide an agent that promotes adhesion of radiation curable resin to the first microstructured molding tool. In embodiments wherein the first microstructured molding tool has a metal microstructured surface, adhesion promotion agents can include silane coupling agents. Suitable silane coupling agents include, for example, gamma-methacryloxypropyltrimethoxysilane, vinyltriethoxysilane, tris(2-methoxyethoxy)vinylsilane, 3,4-epoxycyclohexylmethyltrimethoxysilane, gamma-glycidoxypropyltrimethoxysilane, and gamma-mercaptopropyltrimethoxysilane (e.g., as respectively available as A-174, A-151, A-172, A-186, A-187, and A-189 from Dow Chemical Co.); allyltriethoxysilane, diallyldichlorosilane, divinyldiethoxysilane, and m,p-styrylethyltrimethoxysilane (e.g., as commercially available respectively as A0564, D4050, D6205, and S1588 from United Chemical Industries, Bristol, Pa.); 3-(2-aminoethylamino)propyltrimethoxysilane; vinyltriacetoxysilane; methyltriethoxysilane; and similar compounds; and mixtures thereof. Other agents that facilitate increased adhesion of radiation curable resin to the microstructures surface of the first microstructured tool can also be used.

In some embodiment of the method described herein, a differential pattern curing may be included during the preparation of film articles from molding tools of the present description. Differential pattern curing can be accomplished by methods described herein, as well as those described in U.S. Patent Application No. 61/491,616, entitled "METHODS FOR MAKING DIFFERENTIALLY PATTERN CURED MICROSTRUCTURED ARTICLES", filed on the same date as the instant application, the disclosure of which is incorporated herein by reference.

In some embodiments, articles of the present description include a first major surface comprising first microstructural features within a matrix of second microstructural features, wherein the first major surface is supported on a land layer, and the land layer and first major surface comprise a monolithic structure. In some other embodiments, articles of the present description include a first major surface comprising first microstructural features within a matrix of second microstructural features, wherein the first major surface is supported on an overlay film, and may or may not include a land layer having a thickness in a range of greater than 0 micrometer up to 150 micrometers.

In some embodiments, articles of the present description include an overlay film. The overlay film can be any conventional film used for such purpose, including ionomeric ethylene copolymers, plasticized vinyl halide polymers, acid-functional ethylene copolymers, aliphatic polyurethanes, aromatic polyurethanes, other radiation transmissive elastomers, and combinations thereof. In some embodiments, the overlay film may be a light transmissive support layer.

The light transmissive support layer typically comprises a low elastic modulus polymer to impart easy bending, curling, flexing, conforming, or stretching to the resultant retroreflective composite. Generally, the light transmissive support layer comprises a polymeric film having an elastic modulus of less than $13 \times 10^8$ pascals, and a glass transition temperature less than about 50° C. The polymer preferably is such that the light transmissive support layer retains its physical integrity under the conditions it is exposed to as the resultant composite retroreflective sheeting is formed. The polymer desirably has a Vicat softening temperature that is greater than 50° C. The linear mold shrinkage of the polymer desirably is less than 1 percent, although certain combinations of polymeric materials for the cube-corner elements and the overlay film will tolerate a greater extent of shrinking of the overlay film. Preferred polymeric materials are resistant to degradation by ultraviolet ("UV") light radiation so that the retroreflective sheeting can be used for long-term outdoor applications. The light transmissive support layer may be substantially transparent. For instance, films with a matte finish that become transparent when the resin composition is applied thereto, or that only become transparent during the fabrication process (e.g., in response to the curing conditions used to form the array of cube-corner elements) are useful herein.

The light transmissive support layer may be either a single layer or multi-layer component as desired. If multilayer, the layer to which the array of cube-corner elements is secured should have the properties described herein as useful in that regard with other layers not in contact with the array of cube-corner elements having selected characteristics as necessary to impart desired characteristics to the resultant composite retroreflective sheeting. Either surface of the light transmissive support layer may contain printed or formed (e.g., stamped or embossed) symbols and/or indicia, such as generally described in U.S. Pat. No. 5,763,049 (Frey et al).

Exemplary polymers that may be employed in the light transmissive support layer used herein include fluorinated polymers, ionomeric ethylene copolymers, low density polyethylenes, plasticized vinyl halide polymers, and polyethylene copolymers.

Exemplary fluorinated polymers include poly(chlorotrifluoroethylene) (e.g., such as that available from 3M Company, St. Paul, Minn., under the trade designation "KEL-F800"), poly(tetrafluoroethylene-co-hexafluoropropylene) (e.g., such as that available from Norton Performance, Brampton, Mass., under the trade designation "EXAC FEP"), poly(tetrafluoroethylene-co-perfluoro(alkyl)vinylether) (e.g., such as that available from Norton Performance under the trade designation "EXAC PEA"), and poly(vinylidene fluoride-co-hexafluoropropylene) (e.g., such as that available from Pennwalt Corporation, Philadelphia, Pa., under the trade designation "KYNAR FLEX-2800").

Exemplary ionomeric ethylene copolymers include poly (ethylene-co-methacrylic acid) with sodium or zinc ions (e.g., such as those available from E.I. duPont Nemours, Wilmington, Del., under the trade designations "SURLYN-8920" and "SURLYN-9910").

Exemplary low density polyethylenes include low density polyethylene, linear low density polyethylene, and very low density polyethylene.

Exemplary plasticized vinyl halide polymers include plasticized poly(vinylchloride).

Exemplary polyethylene copolymers that include acid functional polymers include (e.g., poly(ethylene-co-acrylic acid) (EAA), poly(ethylene-co-methacrylic acid) (EMA), poly(ethylene-co-maleic acid), and poly(ethylene-co-fumaric acid)), acrylic functional polymers (e.g., poly(ethylene-co-alkylacrylates) where the alkyl group is methyl, ethyl, propyl, butyl, et cetera, or $CH_3(CH_2)n$- where n is 0 to 12), and poly(ethylene-co-vinylacetate).

In some embodiments, the light transmissive support layer can include aliphatic and aromatic polyurethanes derived from the following monomers (i)-(iii):
- (i) diisocyanates such as dicyclohexylmethane-4,4'-diisocyanate, isophorone diisocyanate, 1,6-hexamethylene diisocyanate, cyclohexyl diisocyanate, diphenylmethane diisocyanate, and combinations of these diisocyanates;
- (ii) polydiols such as polypentyleneadipate glycol, polytetramethylene ether gylcol, polycaprolactonediol, poly-1,2-butylene oxide glycol, and combinations of these polydiols; and
- (iii) chain extenders such as butanediol and hexanediol. Exemplary urethane polymers include those available from Morton International Inc., Seabrook, N.H., under the trade designations "PN-04" and "3429", and the urethane polymer available from B. F. Goodrich Company, Cleveland, Ohio, under the trade designation "X-4107".

The exemplary polymers that may be employed in the light transmissive support layer used herein may also be used in combination with each other. Preferred polymers for the light transmissive support layer include: the ethylene copolymers that contain units that contain carboxyl groups or esters of carboxylic acids (e.g., poly(ethylene-co-acrylic acid) (EAA), poly(ethylene-co-methacrylic acid) (EMA), poly(ethylene-co-vinylacetate)), ionomeric ethylene copolymers, plasticized poly(vinylchloride), and the aliphatic urethanes. These polymers may be preferred, for example, for at least one of the following reasons: suitable mechanical properties, good adhesions to the composite cube-corner layer, clarity, and environmental stability.

Depending on the flexibility of the overlay film, the overlay film may be supported with suitable carrier layer that provides structural and mechanical durability to the overlay element during casting and solidification or curing. The carrier layer may be stripped from overlay element after the resulting article is removed from the molding tool, or left intact for further processing of the resulting article. Use of such a carrier layer is particularly preferred for low modulus overlay films. The carrier layer can be any conventional films, papers or foils used for such purpose, including polyester films, cellulose acetate films, polypropylene films, polycarbonate films, printing paper, kraft paper, security paper, packaging paper, aluminum foil, and copper foil. When the radiation curable resin needs to be irradiated, but the carrier layer is not transparent to the irradiation, the mold is selected to be transparent to the irradiation and irradiation is directed through the mold to the radiation curable resin.

In some embodiments, articles described herein include a reinforcing material. The reinforcing material may include at least one of a woven material, a nonwoven material, a filament, a yarn, or a wire. The reinforcing material can be introduced into the resin prior to radiation curing of the article, using conventional techniques.

In some embodiments, articles of the disclosure have a first major surface comprising first microstructural features and second microstructural features arranged in a pattern visible at least when viewed normal to the first major surface, wherein the first and second microstructural features are different relative to each other, and are selected from the group consisting of cones, diffraction gratings, lenticulars, segments of a sphere, pyramids, cylinders, fresnels, prisms, and combinations thereof. In some embodiments, the first microstructural features have a first pitch, wherein the first pitch is no greater than 1000 micrometers (in some embodiments, no greater than 500, 100, 50, 20, 10, 5, 2, 1, 0.5, 0.2, or even no greater than 0.1 micrometer). In some embodiments, the second microstructural features have a second pitch, wherein the second pitch is no greater than 1000 micrometers (in some embodiments, no greater than 500, 100, 50, 20, 10, 5, 2, 1, 0.5, 0.2, or even no greater than 0.1 micrometer). In some embodiments, the second pitch is no more than 50% (in some embodiments, no more than 20%, 10%, 5%, 2%, or even no more than 1%) of the first pitch.

In some embodiments, the article comprises at least one of colorant or pigment. In some embodiments, the article comprises opaque filler. Exemplary colorants and pigments include titanium dioxide, phthalo blue, red iron oxide, various clays, calcium carbonate, mica, silicas, and talcs. Exemplary fillers include glass beads or fibers, carbon black, flock and mineral reinforcements. Colorants, pigments, and/or fillers can be incorporated into the articles described herein, for example, by adding them using conventional techniques into the polymeric material.

In some embodiments, the article includes a metalized layer. Methods of providing a metalized layer over a cured radiation curable resin are well known in the art, and include those methods for making metalized retroreflective sheeting described in U.S. Pat. No. 4,801,193 (Martin).

Any of a variety of patterns of a matrix of first optical elements having at least one discontinuous region of second optical elements can be provided. For example, in some embodiments a discontinuous region may be in any of a variety of geometric shapes including a circle, oval, square, rectangle, triangle, alphanumeric, etc. In another aspect, for example, in some embodiments, there is a plurality of discontinuous regions of second optical elements within a matrix of first optical elements. In some embodiments at least a portion of the matrix and at least one discontinuous region (and optionally other discontinuous regions if present) collectively exhibit at least a first (second, third, or more) image or indicia (which may be, for example, a trademark or copyrighted material, including a registered trademark or registered copyright as defined under any of the countries, territories, etc. of the world (including the United States)). The patterns of the matrix of first optical elements having at least one discontinuous region of second optical elements (optional additional discontinuous regions) are typically created by the arrangement of the tool used to create optical elements in the article and/or the patterned irradiation used in the method for making the article.

Exemplary uses of the methods described herein include the production of articles having a product security mark, a logo, a trademark, a decorative appearance, and light management properties (e.g., for transmitted light, reflected light, or retroreflected light).

Embodiments

Item 1. A method of making a molding tool, the method comprising:
providing a first molding tool having a first microstructured surface that includes a first plurality of cavities;
providing a second molding tool having a second microstructured surface that includes a second plurality of cavities;
filling at least one of the first or second pluralities of cavities with a radiation curable resin;
contacting the first and second molding tools against the radiation curable resin such that the first and second pluralities of cavities face each other with a layer of the radiation curable resin therebetween and in contact with the first and second pluralities of cavities;
exposing the layer of the radiation curable resin to a patterned irradiation through at least one of the first molding tool or the second molding tool to provide a corresponding partially cured resin layer comprising at least one first region and at least one second region, wherein the at least one first region is irradiated by the patterned irradiation and the at least one second region is not irradiated by the patterned irradiation, and wherein at least one of the first molding tool or the second molding tool is transparent to the patterned irradiation;
separating the second molding tool from the partially cured resin; and
separating the non-irradiated regions of the partially cured resin from the first molding tool, to provide a molding tool having a microstructured surface that includes a pattern of a matrix of first microstructural features and at least one discontinuous region of second microstructural features.

Item 2. The method of item 1, wherein the first molding tool is any one of a roll, a belt, a film, a metal plate, or a glass plate.

Item 3. The method of item 1 or 2, wherein the patterned irradiation comprises at least one of irradiating through transparent regions of a mask, guiding a beam of light, guiding a beam of electrons, or projecting a digital image.

Item 4. The method of item 1, wherein the first microstructured surfaces has a first topography and the second microstructured surfaces has a second topography, and wherein the first and second topographies are nonidentical with respect to each other.

Item 5. The method of item 4, wherein the first and second topographies each have an orientation axis and wherein the orientation axes are nonaligned with respect to each other while exposing the resin layer to the patterned irradiation.

Item 6. The method of item 1, wherein the first microstructured surfaces has a first topography and the second microstructured surfaces has a second topography, and wherein the first and second topographies are identical with respect to each other.

Item 7. The method of item 6, wherein the first and second topographies each have an orientation axis and wherein the orientation axes are nonaligned with respect to each other while exposing the resin layer to the patterned irradiation.

Item 8. The method of any preceding item, wherein the second microstructured surface comprises a release agent.

Item 9. The method of any preceding item, further comprising applying a release coating to the modified microstructured surface on the modified molding tool.

Item 10. The method of any preceding item, further comprising replicating a microstructured article having a microstructured surface complementary to the pattern of the matrix of first microstructural features and the at least one discontinuous region of second microstructural features.

Item 11. The method of any one of items 1 to 9, further comprising replicating a metallic tool from the modified molding tool.

Item 12. An article having a first major surface comprising first microstructural features within a matrix of second microstructural features, wherein the first microstructural features are discontinuous, wherein collectively the first and second microstructural features form a pattern visible at least when viewed normal to the first major surface, and wherein the first and second microstructural features are independently selected from the group consisting of cones, diffraction gratings, lenticulars, segments of a sphere, pyramids, cylinders, fresnels, and prisms.

Item 13. The article of item 12, wherein the first and second microstructural features independently have a pitch in a range from 0.1 micrometer to 1000 micrometers.

Item 14. The article of item 13, wherein the first pitch is up to 90% of the second pitch.

Item 15. The article of item 13, wherein the first pitch is up to 50% of the second pitch.

Item 16. The article of any one of items 12 to 15, wherein the pattern includes at least one of alphanumerics, a first trademark indicia, or a first copyrighted indicia.

Item 17. The article of any one of items 12 to 16, wherein the first and second microstructural features independently comprise at least one of a thermosetting material or a thermoplastic material.

Item 18. The article of any one of items 12 to 17, wherein the pattern comprises regions having no microstructural features.

Item 19. An article having a first major surface comprising first microstructural features and second microstructural features arranged in a pattern visible at least when viewed normal to the first major surface, wherein the first and second microstructural features are different relative to each other, and are selected from the group consisting of cones, diffraction gratings, lenticulars, segments of a sphere, pyramids, cylinders, fresnels, and prisms.

Item 20. The article of item 19, wherein the first and second microstructural features independently have a pitch in a range from 0.1 micrometer to 1000 micrometers.

Item 21. The article of item 20, wherein the first pitch is up to 90% of the second pitch.

Item 22. The article of item 20, wherein the first pitch is up to 50% of the second pitch.

Item 23. The article of any one of items 19 to 22, wherein the pattern includes at least one of alphanumerics, a first trademark indicia, or a first copyrighted indicia.

Item 24. The article of any one of items 19 to 23, wherein the first and second microstructural features independently comprise at least one of a thermosetting material or a thermoplastic material.

Item 25. The article of any one of items 19 to 24, wherein the pattern comprises regions having no microstructural features.

Advantages and embodiments of this invention are further illustrated by the following examples, but the particular materials and amounts thereof recited in these examples, as well as other conditions and details, should not be construed to unduly limit this invention. All parts and percentages are by weight unless otherwise indicated.

EXAMPLES

Materials

| | |
|---|---|
| ArUA | Aromatic urethane acrylate obtained from Cytec Industries Inc., Smyrna, GA, under the trade designation "EBECRYL 220" |
| AUA | Aliphatic urethane acrylate obtained from Cognis Corporation, Cincinnati, OH, under the trade designation "PHOTOMER 6210" |
| BAED-1 | A bisphenol-A epoxy diacrylate obtained from Cytec Industries Inc. under the trade designation "EBECRYL 3720" |
| BAED-2 | A bisphenol-A epoxy diacrylate obtained from Cytec Industries Inc., under the trade designation "EBECRYL 3701" |
| D1173 | A photoinitiator obtained from Ciba Additives, Houston, TX, under the trade designation "DAROCUR 1173" |
| DEAEMA | Diethylaminoethyl methacrylate, obtained from BASF, Freeport, TX |
| HDDA | 1,6-hexanediol diacrylate, obtained from Cytec Industries Inc. |
| I1035 | A stabilizer obtained from Ciba Additives under the trade designation "IRGANOX 1035" |
| I819 | A photoinitiator obtained from Ciba Additives under the trade designation "IRGACURE 819" |
| IBOA | Isobornyl acrylate, obtained from Cytec Industries Inc. |
| PAU | Polyester aliphatic urethane obtained from Morton International Inc., Seabrook, NH, under the trade designation "PN-04" |
| T405 | A stabilizer obtained from Ciba Additives under the trade designation "TINUVIN 405" |
| TMPTA | Trimethylolpropane triacrylate, obtained from Cytec Industries Inc. |
| TPO | (2,4,6-trimethylbenzoyl) diphenylphosphine oxide, a photoinitiator, obtained from Sigma-Aldrich, St. Louis, MO |

Preparation of Composition 1

A first radiation-curable composition (Composition 1) was prepared by mixing 25 wt. % BAED-1, 12% DEAEMA, 38 wt. % TMPTA, 25 wt. % HDDA, 0.5 part per hundred (pph) TPO, 0.2 pph 11035 and 0.5 pph T405 in a glass jar. About 100 grams of the composition were prepared.

Preparation of Composition 2

A second radiation-curable composition (Composition 2) was prepared by mixing 74.5 wt. % AUA, 24.5 wt. % HDDA, 1.0 wt. % D1173 and 0.5 pph TPO in a glass jar. About 100 grams of the composition were prepared.

Preparation of Composition 3

A third radiation-curable composition (Composition 3) was prepared by mixing 58.4 wt. % BAED-2, 20.3 wt. % IBOA, 20.3 wt. % ArUA, and 1 wt. % I819. About 100 grams of the composition were prepared.

Example 1

A patterned tool was prepared using the following procedure, and as generally indicated in FIGS. 1 to 4B. About 10 grams of Composition 3 were poured onto the upper microstructured face of a heated microstructured tool and then spread uniformly using a 250 polyethylene terephthalate (PET) film as a doctor blade. The tool was a nickel plate measuring about 25 cm by 30 cm and 760 micrometers in thickness. The tool had a microstructured surface consisting of cube corner cavities measuring 43 micrometers in depth with a pitch of 86 micrometers. The tool rested on a magnetic hotplate set at 66° C. After filling cavities of the tool with Composition 3 using the doctor blade, a holographic film (obtained from Spectratek Technologies, Inc., Los Angeles, Calif., under the trade designation "PEBBLES—0.002 INCHES, PRINT TREATED POLYESTER, TRANSPARENT") was laminated to the resin using an ink roller to minimize the resin thickness. A mask was placed on top of the holographic film, and two sheets of grooved film (obtained from 3M Company under the trade designation "BRIGHTNESS ENHANCEMENT FILM (BEF) II 90/50") with the grooves crossed at 90 degrees were placed on the mask with the grooves facing the mask to collimate light. A 6.4 millimeter sheet of window glass was placed on the grooved film to ensure intimate contact of the microstructured tool, resin, holographic film, mask, and sheets of grooved film. Radiation was transmitted though the glass, grooved film, mask, and the holographic film using a bank of fluorescent lights (obtained from Philips Lighting, Somerset, N.J., under the trade designation "TL 20W/03") positioned about 3 cm from the tool for 60 seconds. The glass, grooved film, mask, and holographic film were removed from the coated tool, and uncured resin was rinsed from the tool using ethanol, giving a patterned tool. After drying, the patterned tool was irradiated with a Fusion "V" UV lamp (obtained from Fusion Systems, Rockville, Md.) set at 600 watt/2.5 cm (100% power setting) under a nitrogen atmosphere, to provide additional cure. The lamp was positioned 5 cm above the glass plate. The conveyor belt operated at 15.2 meters/min. The patterned tool was then plasma treated with tetramethylsilane using the following procedure to provide a release coating on the microstructured side of the patterned tool.

The release coating was applied by depositing a silicon containing film by plasma deposition. The deposition was carried out in a commercial reactive ion etcher system (obtained from Plasmatherm, Kresson, N.J., under the trade designation "PLASMATHERM MODEL 3032") configured for reactive ion etching (RIE) with a 26-inch (66 cm) lower powered electrode and central gas pumping. The chamber was pumped by a roots blower (obtained from Edwards Vacuum, Ltd., Tewksbury, Mass., under the trade designation "EDWARDS MODEL EH1200") backed by a dry mechanical pump (obtained from Edwards Vacuum, Ltd. under the trade designation "EDWARDS MODEL iQDP80"). RF power was delivered by a 5 kW, 13.56 MHz solid-state generator ("RFPP MODEL RF50S0") through an impedance matching network. The system had a nominal base pressure of 5 mTorr. The flow rates of the gases were controlled by flow controllers (obtained from MKS Instruments, Andover, Mass.). Samples of the polymeric tools were placed on the powered electrode of the batch plasma apparatus. The plasma treatment was done in a series of treatment steps. The features were first treated with an oxygen plasma by flowing oxygen gas at a flow rate of 500 cm³/min and plasma power of 200 watts for 60 seconds. After the oxygen plasma treatment, a silicon containing film was then deposited by flowing tetramethylsilane (TMS) gas at a flow rate of 150 standard cm³/min, plasma power of 200 watts for 120 seconds. After the plasma deposition was completed, the chamber was vented to atmosphere and the patterned tool having a release coating was removed and subsequently used as the tool in the following procedure.

Figure 8:
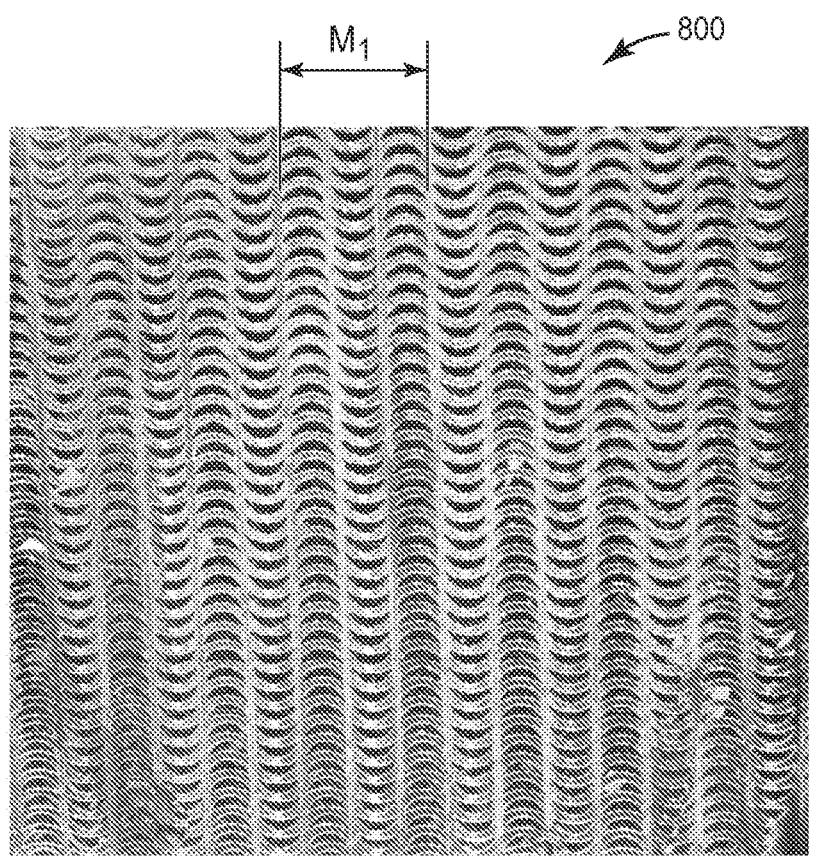
FIG. 8 is a digital photographic image of an exemplary embodiment of an article of the present disclosure, under ambient lighting conditions.

FIG. 8 is a digital photographic image of resulting patterned tool 800 ($M_1$ was about 26 millimeters).

Example 2

Figure 9A:
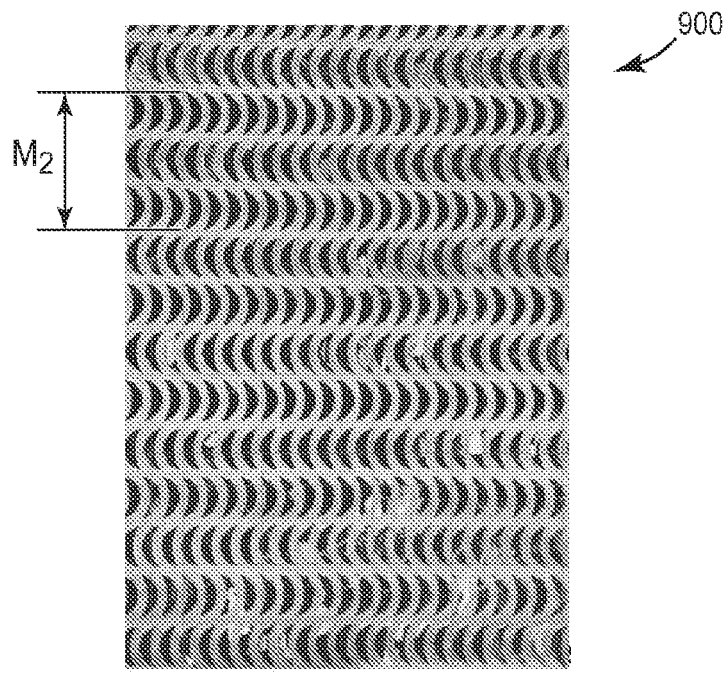
FIGS. 9A and 9B are digital photographic images of an exemplary embodiment of an article of the present disclosure, under ambient lighting and retroreflective lighting conditions, respectively.
Figure 9B:
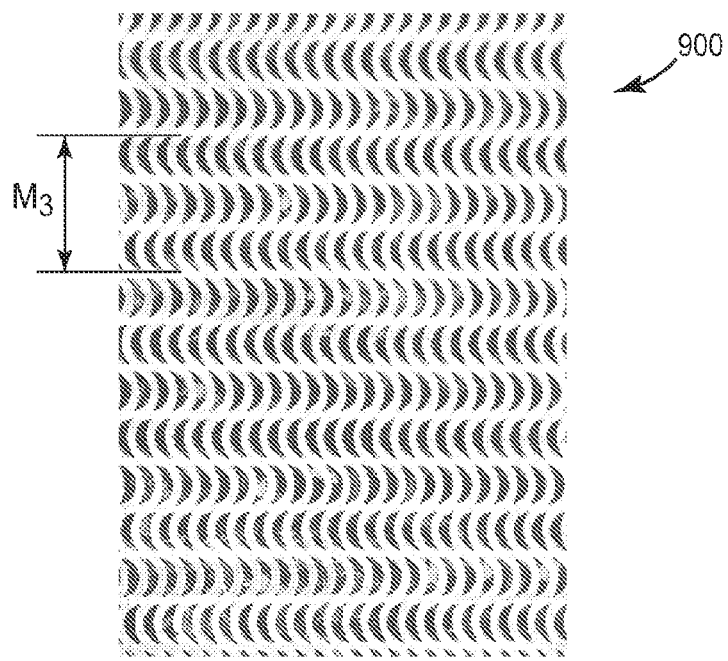

A prismatic retroreflective article was prepared using the following procedure. About 10 grams of Composition 1 were poured on the upper microstructured surface of the patterned tool of Example 1 and then spread uniformly using a 250 micrometer polyester terephthalate (PET) film as a doctor blade. The patterned tool rested on a magnetic hotplate set at 66° C. After filling cavities of the patterned tool with Composition 1 using the doctor blade, giving a coated tool, an overlay film (light transmissive support layer) was then laminated to the coated tool using an ink roller. The overlay film was a clear 50 micrometer PET film coated with 75 micrometers of PAU. The polyurethane coated side of the overlay film was in contact with the coated tool. The assembly consisting of the coated tool and overlay film was then placed on a conveyor belt and passed under a Fusion "D" UV lamp (Fusion Systems) set at 600 watt/2.5 cm to cure the coated composition. The conveyor belt operated at 15.2 meters/min. The composite of overlay film and cured coating composition was then removed from the patterned tool and again passed under a Fusion "D" UV lamp (Fusion Systems) set at 600 watt/2.5 cm, with the microstructures facing the UV lamp set at 600 watt/2.5 cm to complete the curing of the prismatic article. FIGS. 9A and 9B are digital photographic images of the resulting prismatic article under ambient and retroreflective lighting conditions, respectively ($M_2$ and $M_3$ were each about 26 millimeters).

Example 3

Figure 10A:
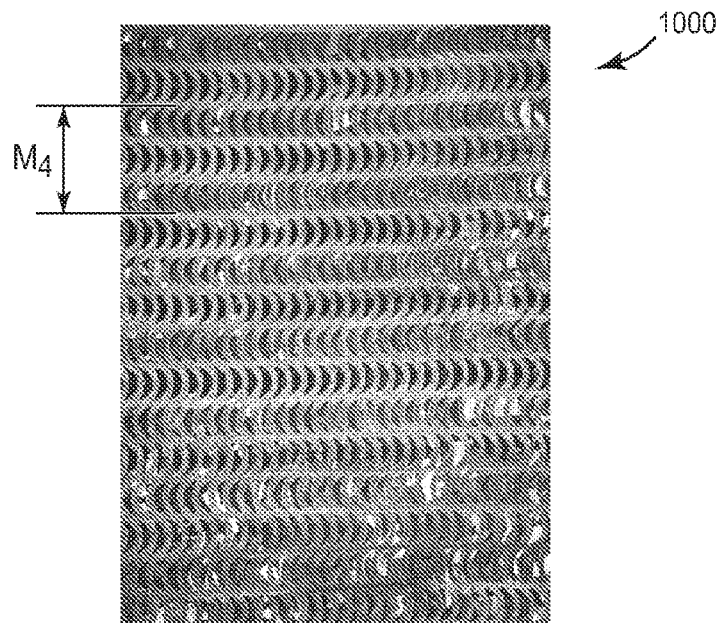
FIGS. 10A and 10B are digital photographic images of an exemplary embodiment of an article of the present disclosure, under ambient lighting and retroreflective lighting conditions, respectively.
Figure 10B:
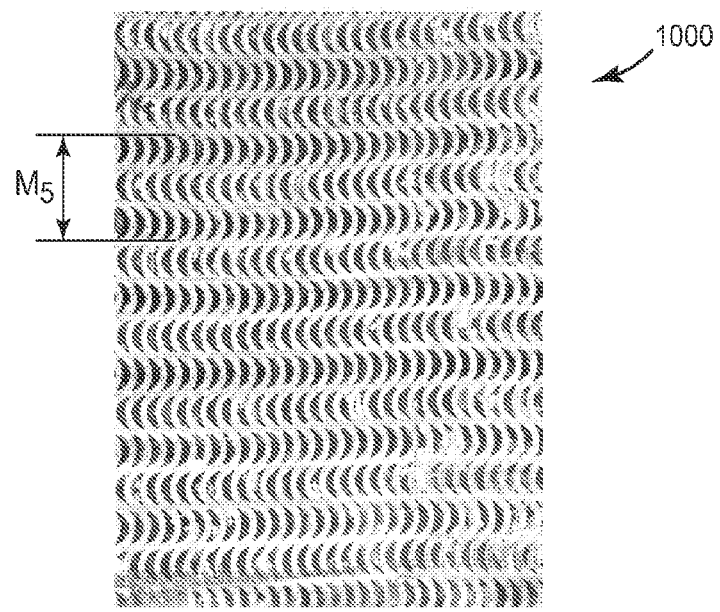

A metalized prismatic article was prepared according to the following procedure. The prismatic article of Example 2 was vapor coated with 100 angstroms of titanium, followed by being vapor coated with 1500 angstroms of aluminum. FIGS. 10A and 10B are digital photographic images of the resulting prismatic article of Example 3 under ambient and retroreflective lighting conditions, respectively ($M_4$ and $M_5$ were each about 26 millimeters).

Example 4

A patterned tool was prepared using the following procedure, and as generally indicated in FIGS. 1 to 4B. About 30 grams of Composition 3 were poured onto the upper microstructured face of a heated metal microstructured tool and then spread uniformly using a 250 micrometer PET film as a doctor blade. The metal microstructured tool was a nickel electroformed plate measuring about 25 cm by 30 cm and 760 micrometers in thickness. The metal microstructured tool had a microstructured surface consisting of 90 degree prismatic grooves measuring 175 micrometers in depth with a pitch of 350 micrometers. The metal microstructured tool rested on a magnetic hotplate set at 66° C. After filling cavities of the metal microstructured tool with Composition 3 using the doctor blade, a plasma tetramethylsilane release treated grooved film tool (obtained from 3M Company under the trade designation "THIN BRIGHTNESS ENHANCING FILM II (90/24)") was laminated to the resin using an ink roller to minimize the resin thickness. The grooves of the grooved film tool were oriented at about 45 degrees relative to the prismatic grooves of the metal microstructured tool. A mask having a pattern that was the negative of the image in FIG. 11A was placed on top of the grooved film tool, and a 6.4 millimeter sheet of window glass was placed on the mask to ensure intimate contact of the metal microstructured tool, resin, grooved film tool, and mask. Radiation was transmitted though the glass, mask, and the grooved film tool using a bank of fluorescent lights ("TL 20W/03") positioned about 3 cm from the resin for 60 seconds. The glass, mask, and grooved film tool were removed from the coated metal microstructured tool, and uncured resin was rinsed from the tool using ethanol, giving a patterned tool. After drying, the coated metal microstructured tool was irradiated with a Fusion "V" UV lamp (Fusion Systems) set at 600 watt/2.5 cm (100% power setting) to irradiate the coated composition under a nitrogen atmosphere. The lamp was positioned 5 cm above the coated metal microstructured tool. The conveyor belt operated at 15.2 meters/min. The coated metal microstructured tool was plasma treated with oxygen and tetramethylsilane to provide a chemical release coating on the tool, using the procedure described in Example 1.

Example 5

Figure 11A:
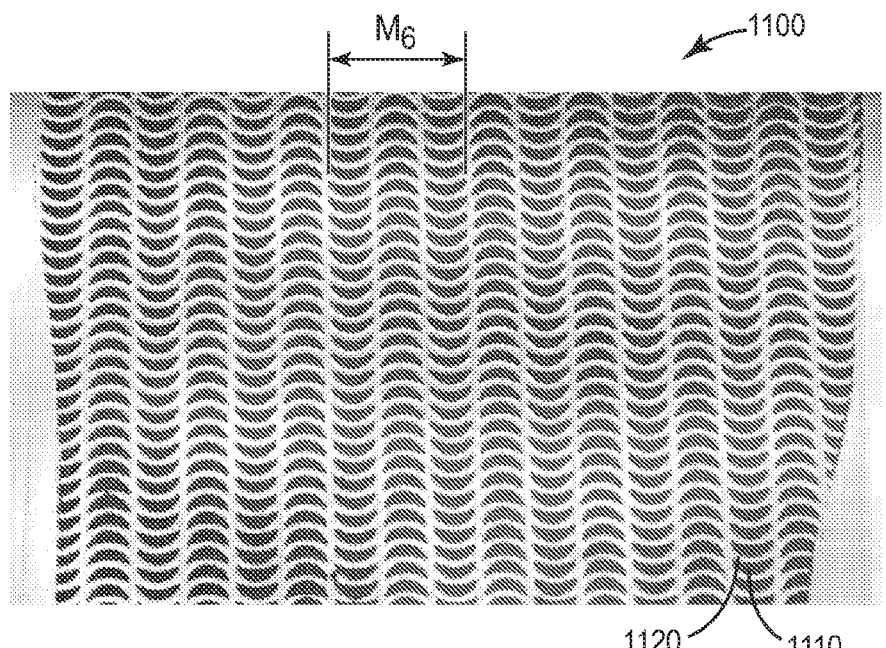
FIG. 11A is a digital photographic image of an exemplary article of the present disclosure.
Figures 11B, 11C:
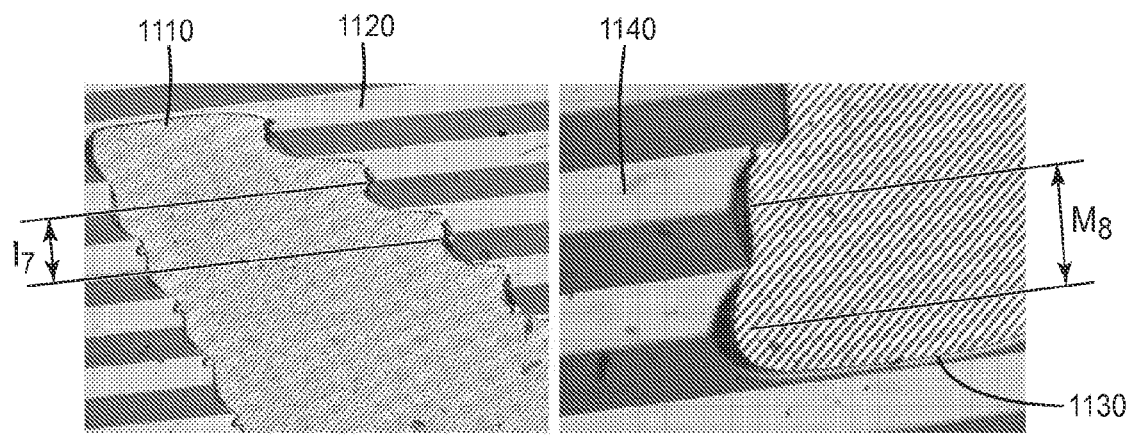
FIGS. 11B and 11C are digital photographic images of portions of the exemplary article in FIG. 11A at magnifications of 100× and 200×, respectively.

A patterned film was produced using the following procedure. About 30 grams of Composition 2 were poured on the upper microstructured surface of the patterned tool of Example 4 and then spread uniformly using a 250 micrometer polyester terephthalate (PET) film as a doctor blade. The patterned tool rested on a magnetic hotplate set at 66° C. After filling cavities of the patterned tool with Composition 2 using the doctor blade, giving a coated tool. An overlay film (light transmissive support layer) was then laminated to the coated tool using an ink roller. The overlay film was a clear, a clear 10 mil polycarbonate film was laminated to the upper face of the coated tool using an ink roller. The assembly consisting of the coated tool and overlay film was then placed on a conveyor belt and passed under a Fusion "D" UV lamp (Fusion Systems) set at 600 watt/2.5 cm to cure the coated composition, forming a patterned film. The conveyor belt operated at 9.1 meters/min. The patterned film was then removed from the patterned tool, and again passed under a Fusion "D" UV lamp (Fusion Systems) set at 600 watt/2.5 cm, with the microstructures facing the UV lamp set at 600 watt/2.5 cm to complete the curing of the patterned film. FIG. 11A is a digital photographic image of the resulting patterned film, and FIGS. 11B and 11C are images of the resulting patterned film under 100× and 200× magnification, respectively ($M_6$ was about 26 millimeters, $M_7$ and Mg were each about 350 micrometers, and the finer grooves in FIGS. 11B and 11C had a 24 micrometer pitch).

Figure 12A:
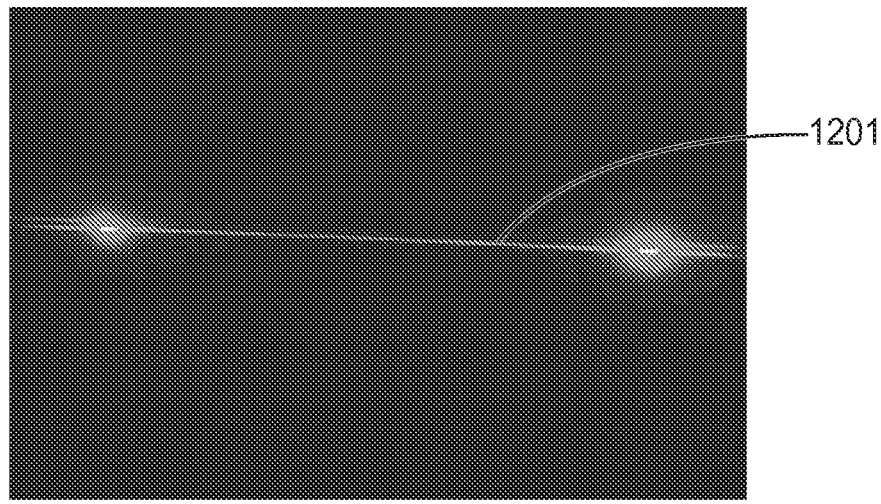
FIG. 12A is a digital photographic images of a diffraction pattern generated by directing a beam of a red laser pointer through the larger grooves of the exemplary article shown in FIGS. 11A to 11C.
Figure 12B:
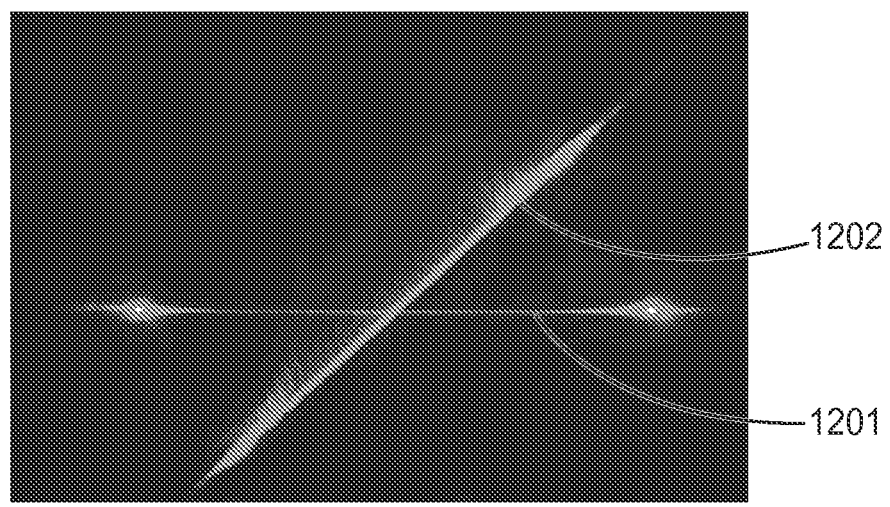
FIG. 12B is a digital photographic images of a diffraction pattern generated by directing a beam of a red laser pointer through a combination of the larger grooves and smaller grooves of the exemplary article shown in FIGS. 11A to 11C.

By directing a laser beam from a red laser pointer through the prism side of the composite film, diffraction patterns were produced and photographed. FIG. 12A shows the laser diffraction pattern of the laser beam passing through the larger grooves, and FIG. 12B shows the combination diffraction pattern of the laser beam passing through both the larger and the smaller grooves.

Example 6

A composite microlens array film was prepared by coating Composition 2 between 50 micrometer PET film (obtained from DUPONT-TEIJIN, Chester, Va., under the trade designation "DUPONT-TEIJIN #618") and a rotary tool at 49 deg C. generating microlenses (lens diameter=40 micrometers, radius of curvature=18.7 microns), according to the process described in U.S. Pat. No. 5,691,846 (incorporated herein by reference). The rubber nip roll gap was set to minimize the amount of resin over the cavities of the tool. The resin was cured through the PET with using two Fusion "D" UV lamps (Fusion Systems) set at 600 watt/2.5 cm (100% power setting). The PET film was fed through the curing station at a rate of 24.4 meter per minute. A release coating was applied to the lens surface of the microlens array film using the plasma deposition procedure described in Example 1. After the plasma deposition procedure was completed, the chamber was vented to atmosphere and the composite microlens array film having a release coating was removed and subsequently used as a "second molding tool" in the preparation of a molding tool of the present disclosure.

Figure 13A:
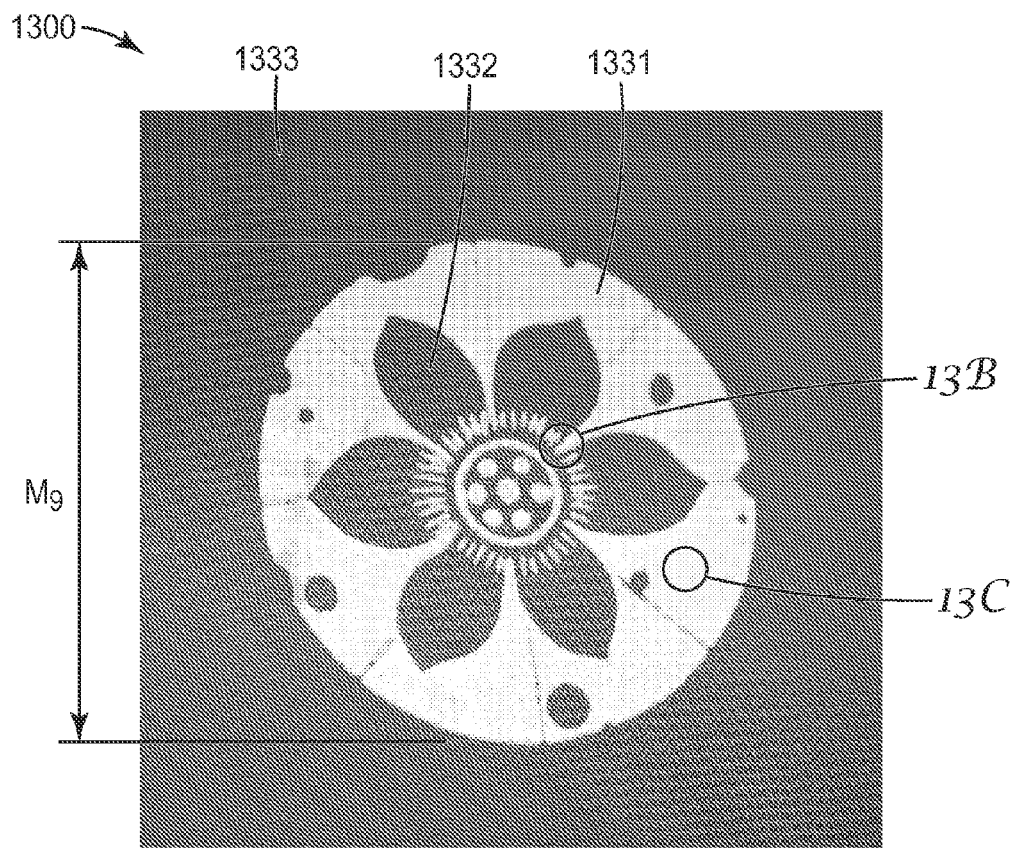
FIG. 13A is a digital photographic images of an exemplary article of the present disclosure.
Figure 13B:
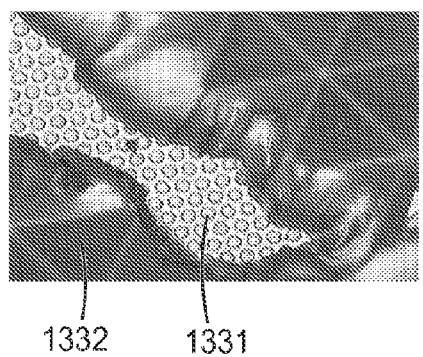
FIGS. 13B and 13C are digital photographic images of portions of the exemplary article in FIG. 13A at a magnification of 400×.
Figure 13C:
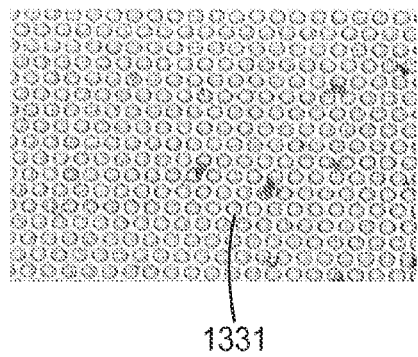

A molding tool of the present disclosure was prepared using the following procedure, and as generally indicated in FIGS. 1 to 4B. About 10 grams of Composition 3 were poured onto the microstructured surface of a first molding tool and then spread uniformly using a 250 micrometer PET film as a doctor blade. The first molding tool was a nickel plate measuring about 25 cm by 30 cm and 760 micrometers in thickness. The first molding tool had a microstructured surface having cube corners measuring 43 micrometers in height with a pitch of 86 micrometers. The first molding tool rested on a magnetic hotplate set at 66° C. After filling cavities of the first molding tool with Composition 3 using the doctor blade, the composite microlens array film having a release coating (i.e., the "second molding tool" as described above) was laminated to the resin using an ink roller to minimize the resin thickness. A mask having a negative image of the pattern in FIG. 12A was placed on top of the composite microlens array film, and two sheets of grooved film (obtained from 3M Company under the trade designation "BRIGHTNESS ENHANCEMENT FILM (BEF) II $^{90}/_{50}$") with the grooves crossed at 90 degrees were placed on the mask with the grooves facing the mask to collimate light. A 6.4 millimeter sheet of window glass was placed on the grooved film to ensure intimate contact of the microstructured tool, resin, microlens array film, mask, and sheets of grooved film. Radiation was transmitted though the glass, grooved film, mask, and the composite microlens array film using a bank of fluorescent lights (obtained from Philips Lighting, Somerset, N.J., under the trade designation "TL 20W/03") positioned about 3 cm from the tool for 60 seconds. The glass, grooved film, mask, and composite microlens array film were removed from the coated tool, and uncured resin was rinsed from the coated tool using ethanol, giving a patterned tool. From this patterned tool, a nickel electroformed replicate of the inverse topography was prepared as a molding tool. FIG. 13A is a digital photographic image of the resulting molding tool under ambient lighting conditions ($M_9$ is about 38 millimeters). FIGS. 13B and 13C are magnified (400×) digital photographic images of regions of the resulting molding tool, showing an area with microlenses 1231 in proximity to cube corners 1232 (FIG. 13B), and an area with microlenses and no cube corners (FIG. 13C).

Example 7

A retroreflective article was prepared using the following procedure. About 10 grams of Composition 2 were poured onto the upper microstructured face of the patterned microstructured tool of Example 6 and then spread uniformly using a 250 micrometer PET film as a doctor blade. The tool rested on a magnetic hotplate set at 60° C. After filling cavities of the tool with Composition 2 using the doctor blade, a clear 200 micrometer polycarbonate (PC) (obtained from SABIC Innovative Plastics, Pittsfield, Mass., under the trade designation "LEXAN") film was laminated to the upper face of the coated tool using an ink roller. A masking film was then placed on top of the PC film. The masking film was a 100 micrometer PET photolithographic printed film having clear crescent-shaped images on a black field, which was the negative of the images shown in FIG. 14, having field 1433 and crescents 1434. A 0.6 cm thick clear glass plate was then placed on top of the mask.

Figure 14:
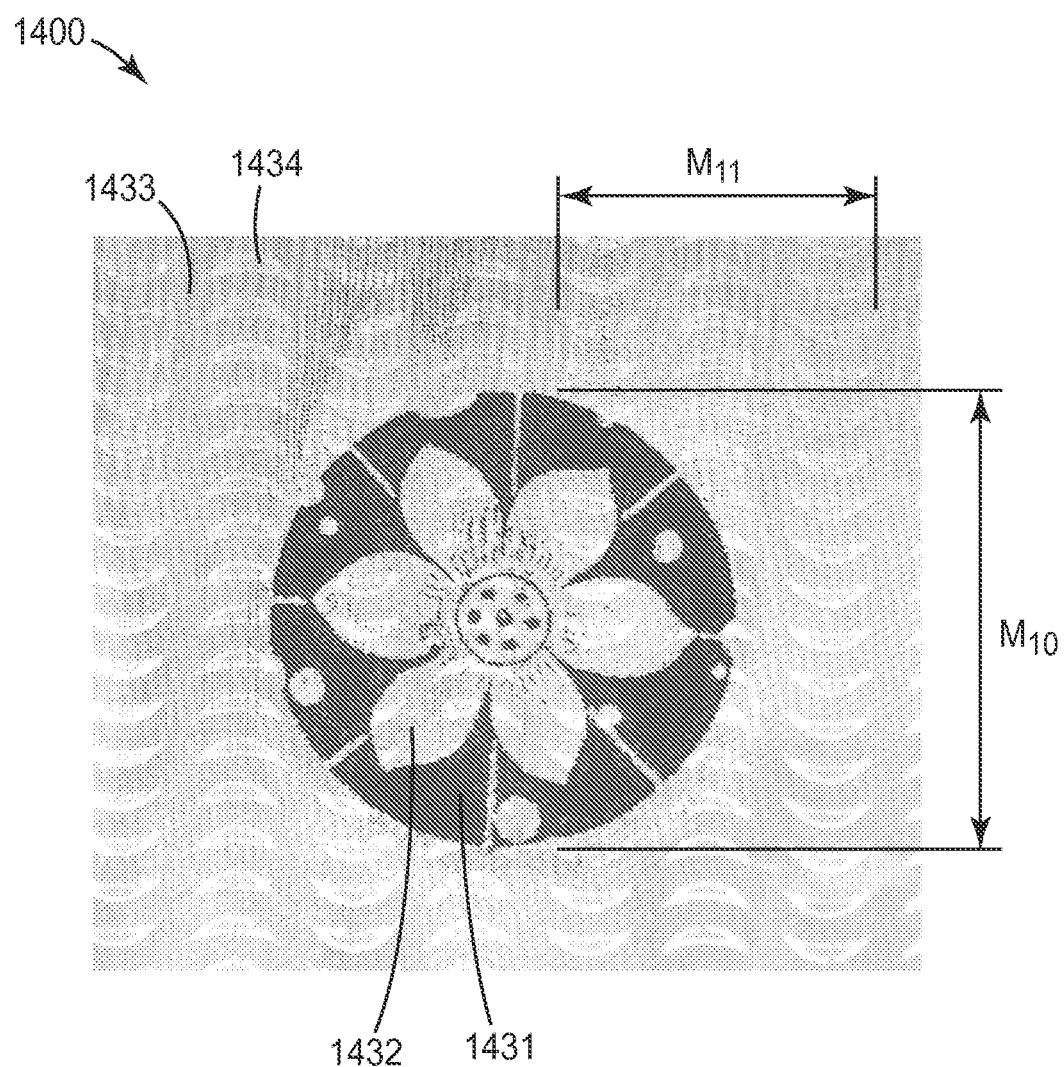
FIG. 14 is a digital photographic images of an exemplary article of the present disclosure.

The assembly consisting of the coated tool, PC overlay film, masking film and glass plate was then placed on a conveyor belt and passed under an ultraviolet (UV) lamp to cure the coated composition. In a first curing step, a Fusion "D" UV lamp (Fusion Systems) set at 600 watt/2.5 cm (100% power setting) was used to irradiate the coated composition. The lamp was positioned 5 cm above the glass plate. The conveyor belt operated at 10.7 meters/min. Following the UV exposure, the glass plate and masking film were removed from the coated tool. The assembly consisting of the coated tool and PC overlay film was then placed on a conveyor belt and passed under a Fusion "D" UV lamp (Fusion Systems) set at 600 watt/2.5 cm (100% power setting) to cure the coated composition. FIG. 14 is a digital photographic image of the resulting molding tool under retroreflective lighting conditions ($M_{10}$ is about 38 millimeters, and $M_{11}$ is about 26 millimeters). Darker region 1431 includes microlenses (and the regions have little or no retroreflectivity), and lighter regions 1432, 1433 and 1434 include retroreflective cube corners. Crescents 1434 received more irradiation than surrounding field 1433, and in FIG. 13 crescents 1434 appear lighter than surrounding field 1433.

Example 8

Figure 15A:
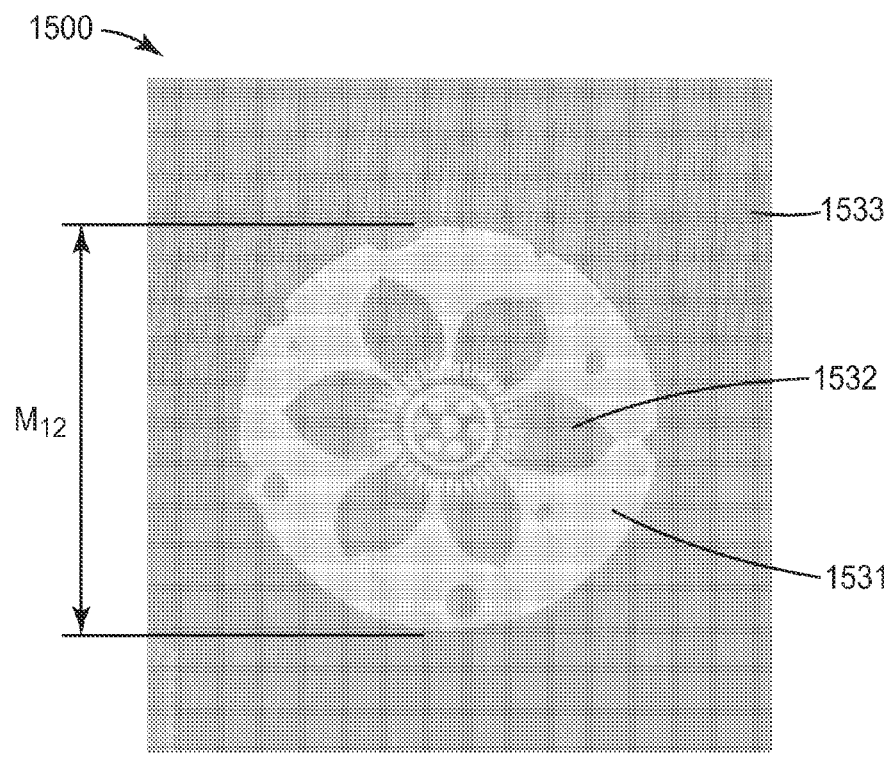
FIGS. 15A and 15B are digital photographic images of an exemplary embodiment of an article of the present disclosure, under ambient lighting and retroreflective lighting conditions, respectively.
Figure 15B:
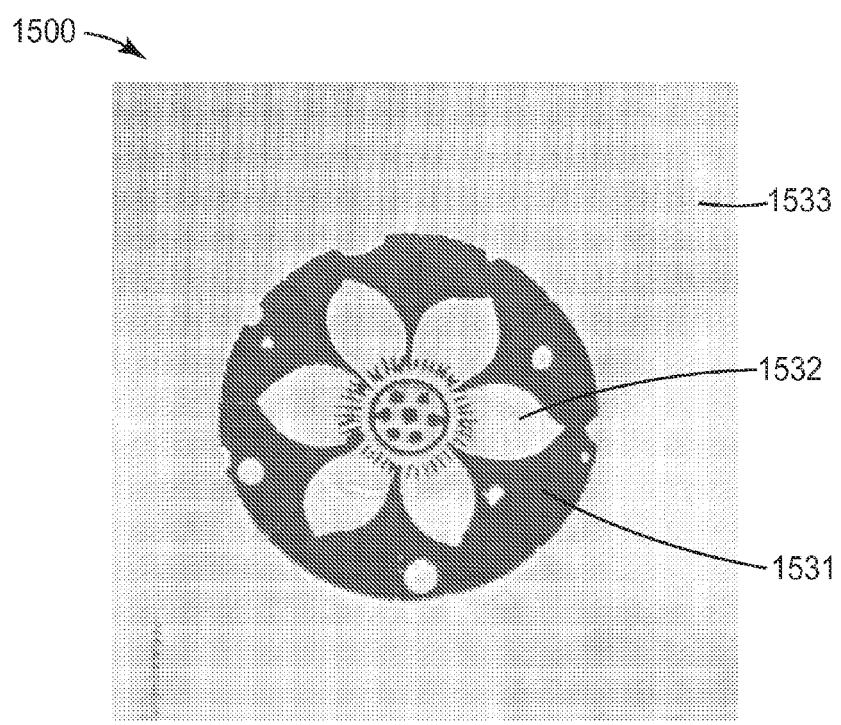

A retroreflective article was prepared using the procedure of Example 7, except that the masking film was not included. FIG. 15A is a digital photographic image of the resulting molding tool 1400 under ambient lighting conditions ($M_{12}$ is about 38 millimeters), and FIG. 15B is a digital photographic image of the resulting molding tool 1400 under retroreflective lighting conditions. In FIG. 15B, darker region 1531 includes microlenses (and the regions have little or no retroreflectivity), and lighter regions 1532 and 1533 include retroreflective cube corners.

Foreseeable modifications and alterations of this disclosure will be apparent to those skilled in the art without departing from the scope and spirit of this invention. This invention should not be restricted to the embodiments that are set forth in this application for illustrative purposes.

What is claimed is:

1. A method of making a molding tool, the method comprising:
   providing a first molding tool having a first microstructured surface that includes a first plurality of cavities;
   providing a second molding tool having a second microstructured surface that includes a second plurality of cavities;
   filling at least one of the first or second pluralities of cavities with a radiation curable resin;
   contacting the first and second molding tools against the radiation curable resin such that the first and second pluralities of cavities face each other with a layer of the radiation curable resin therebetween and in contact with the first and second pluralities of cavities;
   exposing the layer of the radiation curable resin to a patterned irradiation through at least one of the first molding tool or the second molding tool to provide a corresponding partially cured resin layer comprising at least one first region and at least one second region, wherein the at least one first region is irradiated by the patterned irradiation and the at least one second region is not irradiated by the patterned irradiation, and wherein at least one of the first molding tool or the second molding tool is transparent to the patterned irradiation;
   separating the second molding tool from the partially cured resin; and
   separating the non-irradiated regions of the partially cured resin from the first molding tool, to provide a modified molding tool having a modified microstructured surface that includes a pattern of a matrix of first microstructural features and at least one discontinuous region of second microstructural features, wherein the patterned irradiation comprises at least one of irradiating through transparent regions of a mask, guiding a beam of light, guiding a beam of electrons, or projecting a digital image.

2. The method of claim 1, wherein the first molding tool is any one of a roll, a belt, a film, a metal plate, or a glass plate.

3. The method of claim 1, wherein the first microstructured surfaces has a first topography and the second microstructured surfaces has a second topography, and wherein the first and second topographies are nonidentical with respect to each other.

4. The method of claim 3, wherein the first and second topographies each have an orientation axis and wherein the orientation axes are nonaligned with respect to each other while exposing the resin layer to the patterned irradiation.

5. The method of claim 1, wherein the first microstructured surfaces has a first topography and the second microstructured surfaces has a second topography, and wherein the first and second topographies are identical with respect to each other.

6. The method of claim 5, wherein the first and second topographies each have an orientation axis and wherein the orientation axes are nonaligned with respect to each other while exposing the resin layer to the patterned irradiation.

7. The method of claim 1, wherein the second microstructured surface comprises a release agent.

8. The method of claim 1, further comprising applying a release coating to the modified microstructured surface on the modified molding tool.

9. The method of claim 1, further comprising replicating a microstructured article having a microstructured surface complementary to the pattern of the matrix of first microstructural features and the at least one discontinuous region of second microstructural features.

10. The method of claim 1, further comprising replicating a metallic tool from the modified molding tool.

* * * * *